(12) United States Patent
Wei et al.

(10) Patent No.: US 11,145,762 B2
(45) Date of Patent: Oct. 12, 2021

(54) MULTI-GATE DEVICE

(71) Applicant: Taiwan Semiconductor Manufacturing Co., Ltd., Hsinchu (TW)

(72) Inventors: Huan-Sheng Wei, Taipei (TW); Hung-Li Chiang, Taipei (TW); Chia-Wen Liu, Taipei (TW); Yi-Ming Sheu, Hsinchu (TW); Zhiqiang Wu, Hsinchu County (TW); Chung-Cheng Wu, Hsin-Chu County (TW); Ying-Keung Leung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 151 days.

(21) Appl. No.: 16/016,748

(22) Filed: Jun. 25, 2018

(65) Prior Publication Data

US 2018/0301560 A1  Oct. 18, 2018

Related U.S. Application Data

(62) Division of application No. 15/355,844, filed on Nov. 18, 2016, now Pat. No. 10,008,603.

(51) Int. Cl.
| | | |
|---|---|---|
| *H01L 29/78* | (2006.01) | |
| *H01L 29/786* | (2006.01) | |
| *H01L 21/02* | (2006.01) | |
| *H01L 21/306* | (2006.01) | |
| *H01L 21/311* | (2006.01) | |
| *H01L 29/06* | (2006.01) | |
| *H01L 29/08* | (2006.01) | |
| *H01L 29/165* | (2006.01) | |
| *H01L 29/423* | (2006.01) | |
| *H01L 29/66* | (2006.01) | |

(52) U.S. Cl.
CPC .... *H01L 29/7851* (2013.01); *H01L 21/02236* (2013.01); *H01L 21/02532* (2013.01); *H01L 21/30604* (2013.01); *H01L 21/31111* (2013.01); *H01L 29/0673* (2013.01); *H01L 29/0847* (2013.01); *H01L 29/165* (2013.01); *H01L 29/42392* (2013.01); *H01L 29/66545* (2013.01); *H01L 29/66795* (2013.01); *H01L 29/78654* (2013.01); *H01L 29/78696* (2013.01); *H01L 29/7848* (2013.01)

(58) Field of Classification Search
CPC ...................................................... H01L 29/78
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |

(Continued)

FOREIGN PATENT DOCUMENTS

| | | |
|---|---|---|
| CN | 102646624 A | 8/2012 |
| KR | 10-2015-0142632 | 12/2015 |

(Continued)

*Primary Examiner* — Marvin Payen
(74) *Attorney, Agent, or Firm* — Haynes and Boone, LLP

(57) ABSTRACT

A multi-gate semiconductor device having a fin element, a gate structure over the fin element, an epitaxial source/drain feature adjacent the fin element; a dielectric spacer interposing the gate structure and the epitaxial source/drain feature.

20 Claims, 63 Drawing Sheets

(56) References Cited

U.S. PATENT DOCUMENTS

| | | |
|---|---|---|
| 9,111,746 B2 | 8/2015 | Ranjan et al. |
| 9,450,046 B2 | 9/2016 | Wen et al. |
| 9,859,429 B2 | 1/2018 | Ching et al. |
| 2008/0135949 A1 | 6/2008 | Lo et al. |
| 2014/0282326 A1 | 9/2014 | Chen et al. |
| 2016/0049516 A1 | 2/2016 | Huang et al. |

FOREIGN PATENT DOCUMENTS

| | | |
|---|---|---|
| KR | 10-1600738 | 3/2016 |
| TW | 201607039 A | 2/2016 |

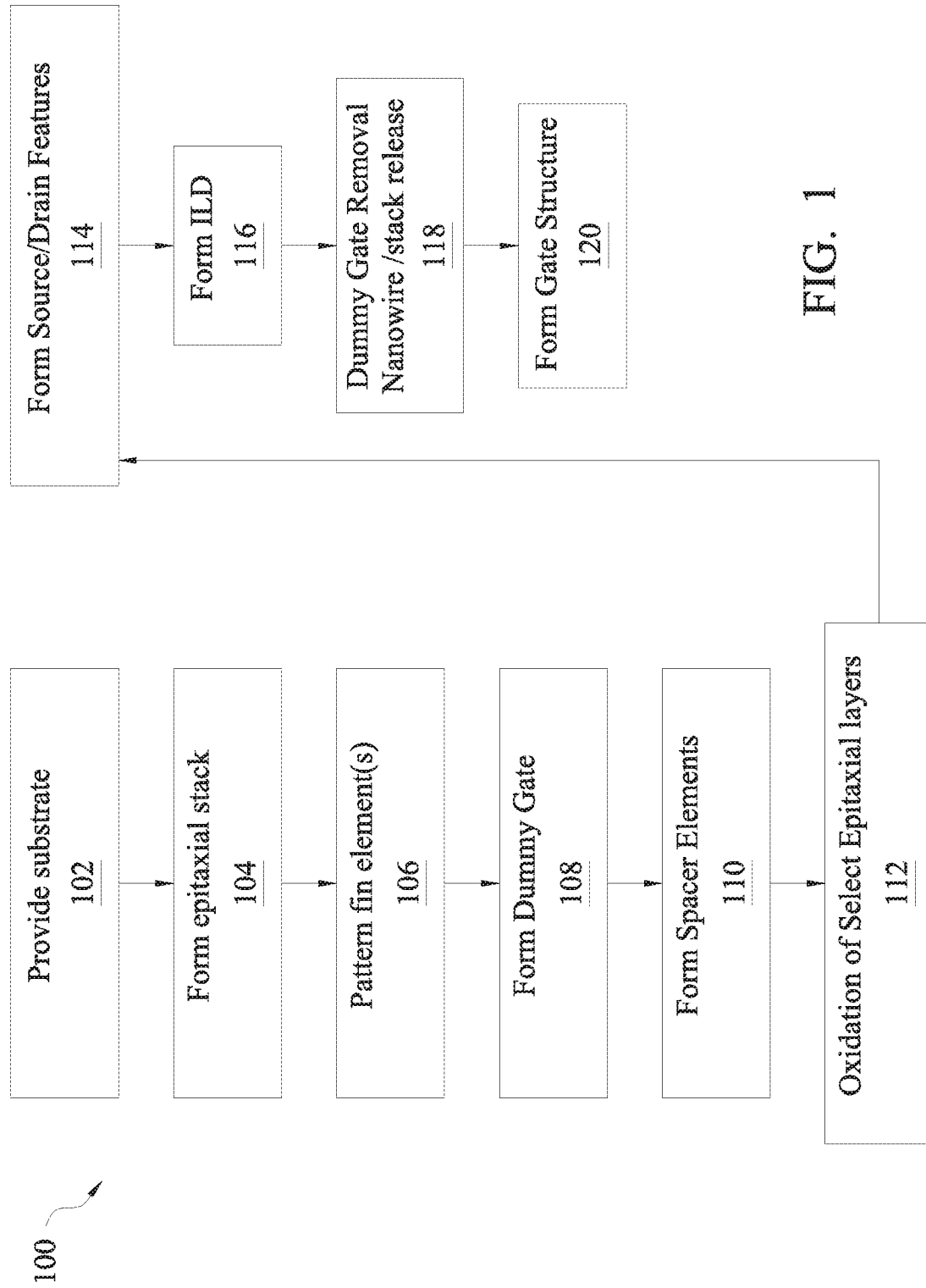

X - X'

X - X'

X - X'

X - X'

X - X'

X - X'

X - X'

Y - Y'

Y2 - Y2'

X - X'

X - X'

X - X'

Y - Y'

Y2 - Y2'

X - X'

X - X'

X - X'

X - X'

X - X'

Y - Y'

Y2 - Y2'

MULTI-GATE DEVICE

PRIORITY DATA

The present application is a divisional application of U.S. patent application Ser. No. 15/355,844, filed Nov. 18, 2016, issuing as U.S. patent Ser. No. 10/008,603, entitled "MULTI-GATE DEVICE AND METHOD OF FABRICATION THEREOF," each of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, challenges with respect to performance of the resulting device may not be satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method of fabricating a multi-gate device or portion provided according to one or more aspects of the present disclosure and including an isolation region under the gate;

DETAILED DESCRIPTION

Figure 2A:
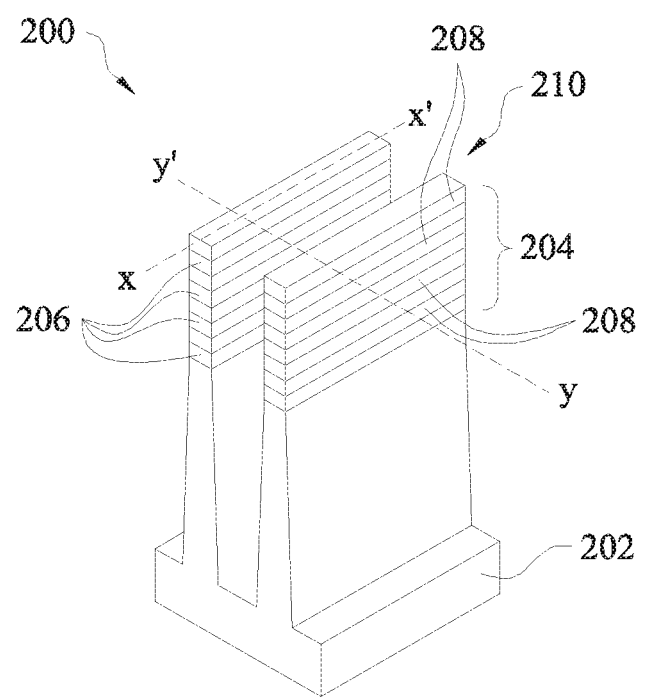
FIGS. 2A, 3A, 4A, 5A, 6A, 7A, 7E, 8A, 9A, and 10A are isometric views of an embodiment of a device 200 according to aspects of the method of FIG. 1.
Figure 2B:
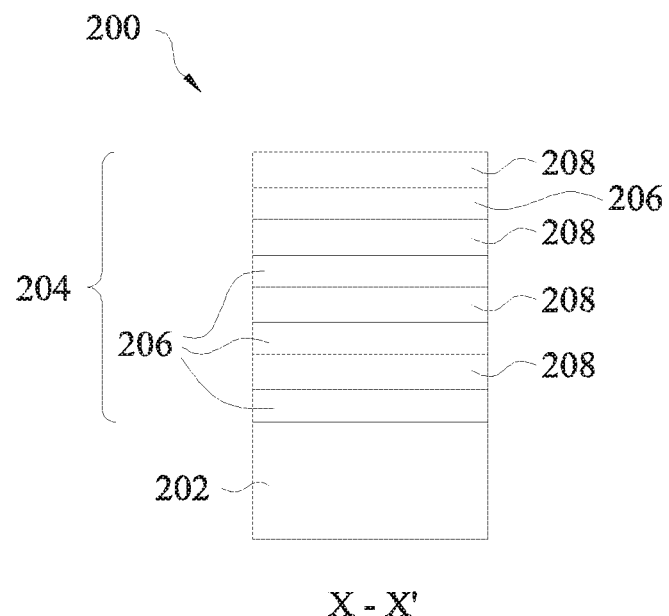
FIGS. 2B, 2C, 3B, 3C, 3D, 4B, 4C, 4D, 5B, 5C, 5D, 6B, 6C, 6D, 7B, 7C, 7D, 8B, 8C, 8D, 9B, 9C, 9D, 10B, 10C, and 10D are cross-sectional views of an embodiment of a device 200 according to aspects of the method of FIG. 1.
Figure 2C:
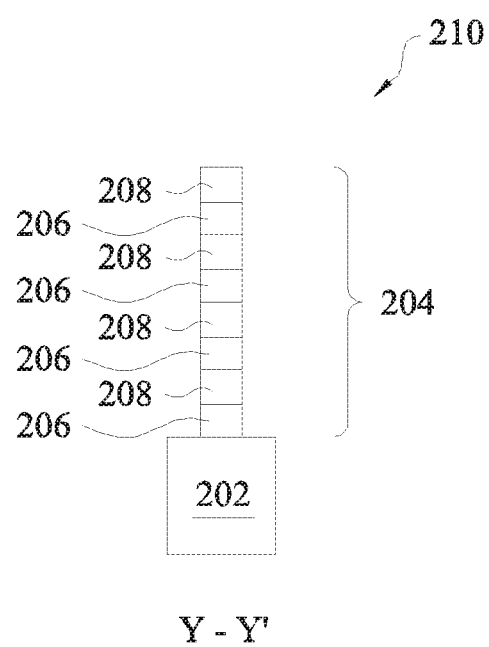

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Illustrated in FIG. 1 is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIGS. 2A, 3A, 4A, 5A, 6A, 7A, 7E, 8A, 9A, and 10A are isometric views of an embodiment of a semiconductor device 200 according to various stages of the method 100 of FIG. 1. FIGS. 2B, 3B, 4B, 5B, 6B, 7B, 8B, 9B, and 10B are corresponding cross-sectional side views of an embodiment of a semiconductor device 200 along a first cut X-X'; FIGS. 2C, 3C, 4C, 5C, 6C, 7C, 8C, 9C, and 10C are corresponding cross-sectional side views of an embodiment of a semiconductor device 200 along a second cut Y-Y', the second cut being in the gate region; FIGS. 3D, 4D, 5D, 6D, 7D, 8D, 9D, and 10D are corresponding cross-sectional side views of an embodiment of a semiconductor device 200 along a third cut Y2-Y2', the third but being in a source/drain region.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-10, as with the remainder of the method and exemplary figures provided in this disclosure, are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

In an embodiment of the method 100, in block 102, an anti-punch through (APT) implant is performed. The APT implant may be performed in a region underlying the channel region of a device for example, to prevent punch-through or unwanted diffusion.

Returning to FIG. 1, the method 100 then proceeds to block 104 where one or more epitaxial layers are grown on the substrate. With reference to the example of FIG. 2, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of the multi-gate device 200. For example, the epitaxial layers 208 may be referred to as "nanowires" used to form a channel region of a multi-gate device 200 such as a GAA device. These "nanowires" are also used to form portions of the source/drain features of the multi-gate device 200 as discussed below. Again, as the term is used herein, "nanowires" refers to semiconductor layers that are cylindrical in shape as well as other configurations such as, bar-shaped. The use of the epitaxial layers 208 to define a channel or channels of a device is further discussed below.

It is noted that four (4) layers of each of epitaxial layers 206 and 208 are illustrated in FIG. 2, this is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch selectivity properties. In various embodiments, the epitaxial layers 206, 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

The method 100 then proceeds to block 106 where fin elements are patterned and formed. With reference to the example of FIG. 2, in an embodiment of block 106, a plurality of fin elements 210 extending from the substrate 202 are formed. In various embodiments, each of the fin elements 210 includes a substrate portion formed from the substrate 202, portions of each of the epitaxial layers of the epitaxial stack including epitaxial layers 206 and 208.

The fin elements 210 may be fabricated using suitable processes including photolithography and etch processes. The photolithography process may include forming a photoresist layer over the substrate 202 (e.g., over the epi stack 204), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers 204 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

In some embodiments, the dielectric layer may include $SiO_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer (and subsequently formed STI features 302) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. The CMP process may planarize the top surface thereby forming STI features 302. The STI features 302 interposing the fin elements are recessed. Referring to the example of FIG. 3A, the STI features 302 are recessed providing the fins 210 extending above the STI features 302. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 210. The height 'H' exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin. In some embodiments, forming the fins may include a trim process to decrease the width of the fins. The trim process may include wet or dry etching processes.

The method 100 then proceeds to block 108 where sacrificial layers/features are formed and in particular, a dummy gate structure. While the present discussion is directed to a replacement gate process whereby a dummy gate structure is formed and subsequently replaced, other configurations may be possible.

Figure 3A:
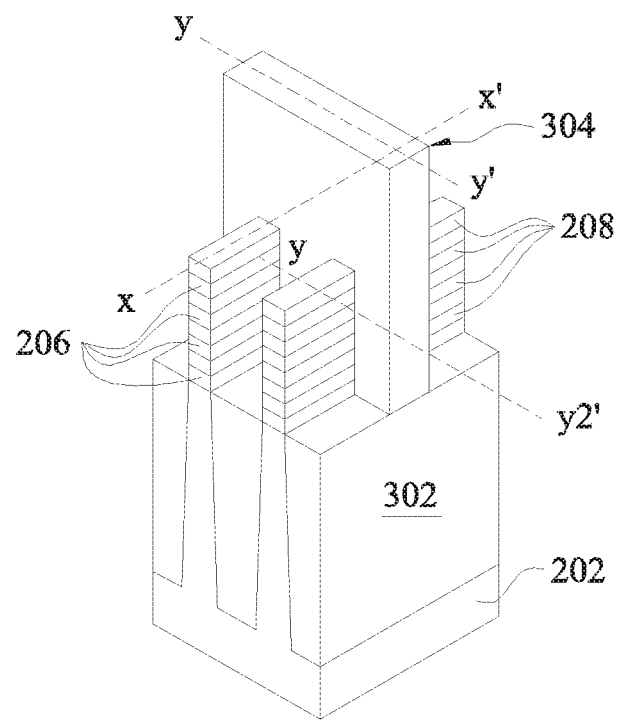
Figure 3B:
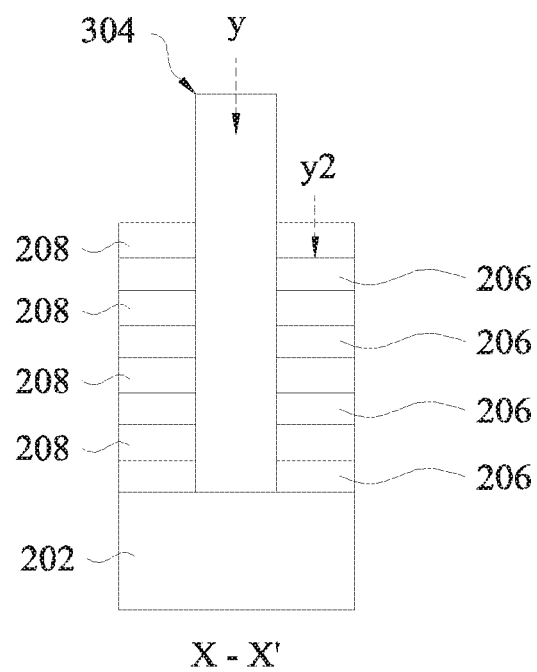
Figure 3C:
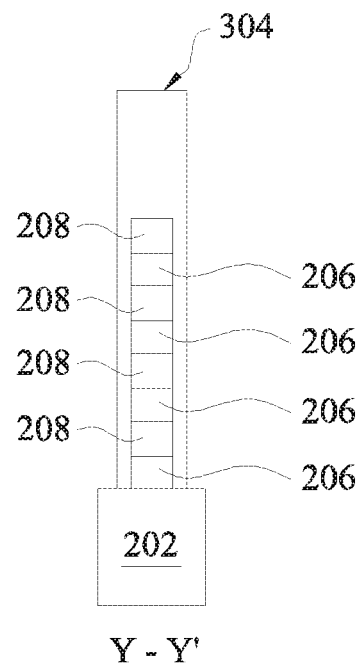
Figure 3D:
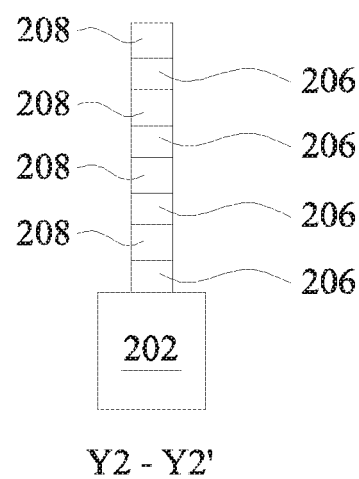

With reference to FIG. 3A, 3B, 3C, a gate stack 304 is formed. In an embodiment, the gate stack 304 is a dummy (sacrificial) gate stack that is subsequently removed as discussed with reference to block 118 of the method 100.

Thus, in some embodiments using a gate-last process, the gate stack 304 is a dummy gate stack and will be replaced by the final gate stack at a subsequent processing stage of the device 200. In particular, the gate stack 304 may be replaced at a later processing stage by a high-K dielectric layer (HK) and metal gate electrode (MG) as discussed below. In some embodiments, the gate stack 304 is formed over the substrate 202 and is at least partially disposed over the fin elements 210. The portion of the fin elements 210 underlying the gate stack 304 may be referred to as the channel region. The gate stack 304 may also define a source/drain region of the fin elements 210, for example, the regions of the fin and epitaxial stack 204 adjacent and on opposing sides of the channel region.

In some embodiments, the gate stack 304 includes the dielectric layer and a dummy electrode layer. The gate stack 304 may also include one or more hard mask layers (e.g., oxide, nitride). In some embodiments, the gate stack 304 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 304 may include an additional gate dielectric layer. For example, the gate stack 304 may include silicon oxide. Alternatively or additionally, the gate dielectric layer of the gate stack 304 may include silicon nitride, a high-K dielectric material or other suitable material. In some embodiments, an electrode layer of the gate stack 304 may include polycrystalline silicon (polysilicon). Hard mask layers such as $SiO_2$, $Si_3N_4$, silicon oxynitride, alternatively include silicon carbide, and/or other suitable compositions may also be included.

The method 100 then proceeds to block 110 where a spacer material layer is deposited on the substrate. The spacer material layer may be a conformal layer (see, e.g., FIG. 4) that is subsequently etched back to form spacer elements (see, e.g., FIG. 5).

Figure 4A:
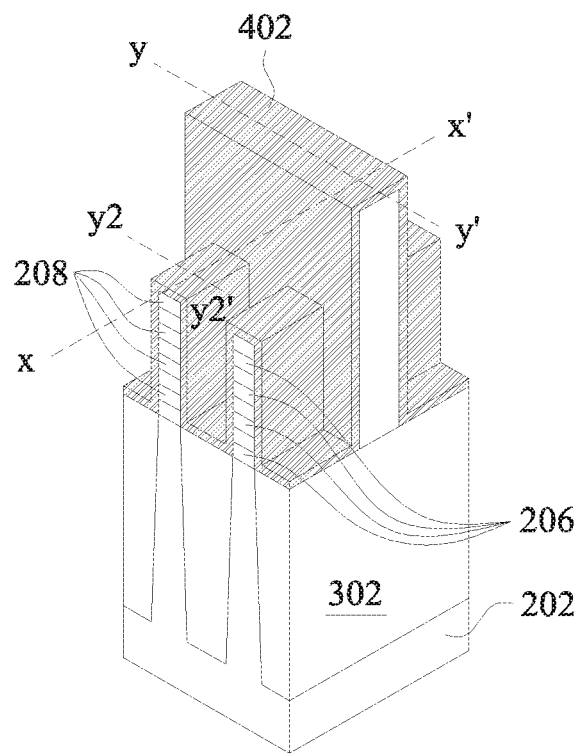
Figure 4B:
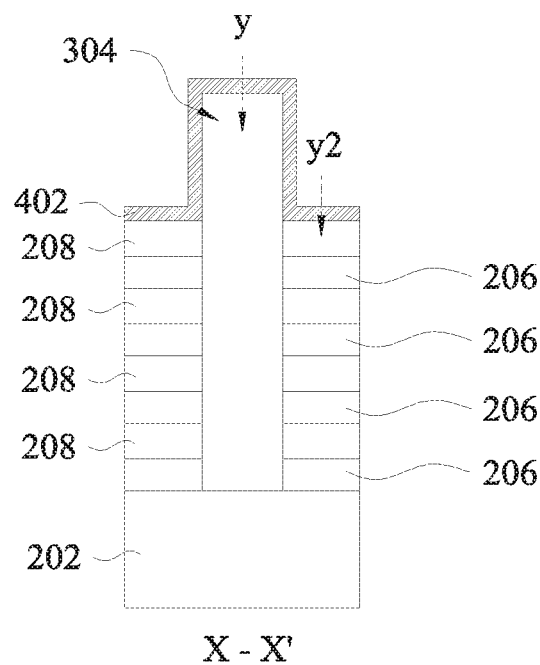
Figure 4C:
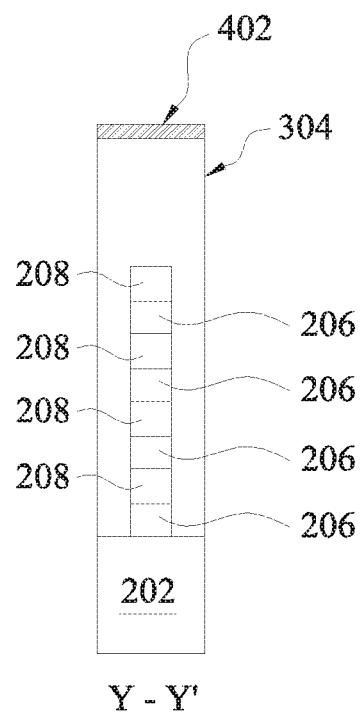
Figure 4D:
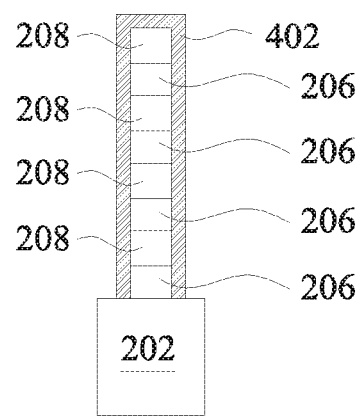

Referring to the example of FIGS. 4A, 4B, 4C, and 4D, a spacer material layer 402 is disposed on the substrate 202. The spacer layer 402 may include a dielectric material such as silicon oxide, silicon nitride, silicon carbide, silicon oxynitride, SiCN films, silicon oxycarbide, SiOCN films, and/or combinations thereof. In some embodiments, the spacer material layer 402 includes multiple layers, such as main spacer walls, liner layers, and the like. By way of example, the spacer material layer 402 may be formed by depositing a dielectric material over the gate stack 304 using processes such as, CVD process, a subatmospheric CVD (SACVD) process, a flowable CVD process, an ALD process, a PVD process, or other suitable process. It is noted that the spacer conformal layer 402 is illustrated in FIG. 4B as covering the epitaxial stack 204. It is noted that in the X-X' cut through the epitaxial stack 304, the spacer layer 402 is actually offset (i.e., out from the page) (see FIG. 4A).

Figure 5A:
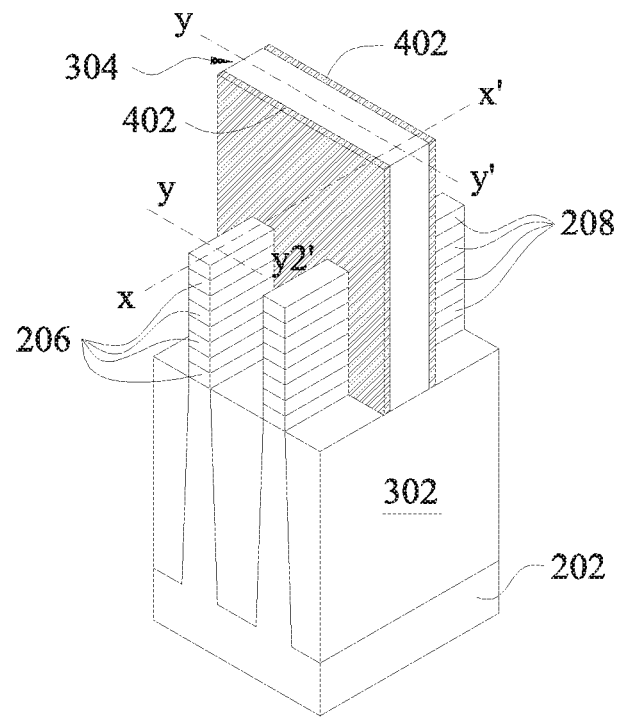
Figure 5B:
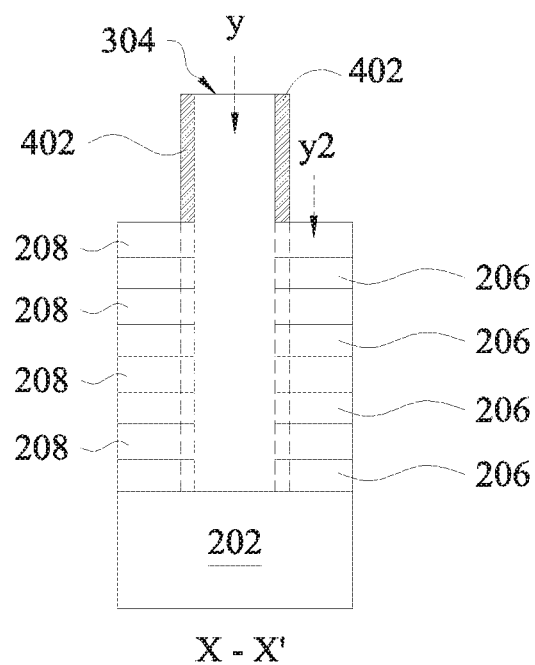
Figure 5C:
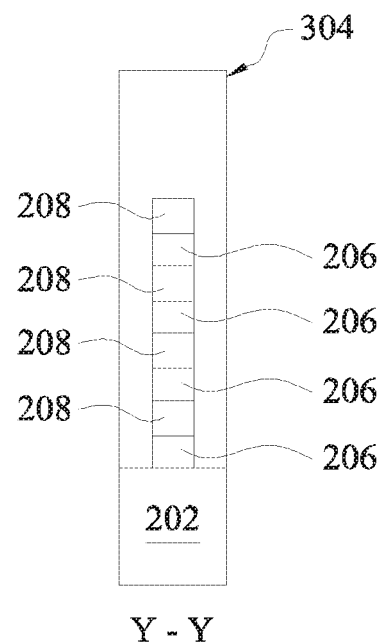
Figure 5D:
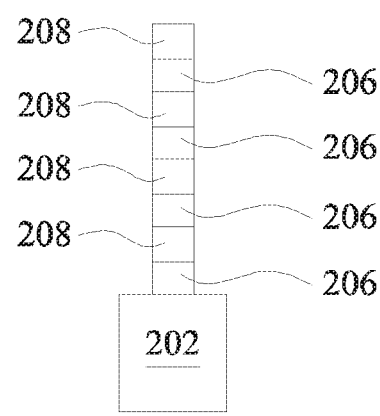

In some embodiments, the deposition of the spacer material layer is followed by an etching back (e.g., anisotropically) the dielectric spacer material. Referring to the example, with reference to the example of FIGS. 5A, 5B, 5C, and 5D, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A, 5B, and 5D. The spacer layer 402 may be removed from a top surface of the gate stack 304, as illustrated in FIG. 5C. It is again noted in the X-X' cut through the epitaxial stack 304 that the spacer elements of spacer material layer 402 are actually offset (i.e., out from the page of FIG. 5B) (see FIG. 5A) from a cut through the epitaxial stack 304; in other words, both the spacer element, the layer 206, and the layer 208 abut the sidewall of the gate structure 304. See also, FIGS. 6B, 7B, 8B, 9B, and 10B.

The method 100 then proceeds to block 112 where an oxidation process is performed. The oxidation process may be referred to as a selective oxidation as due to the varying oxidation rates of the layers of the epitaxial stack 204, certain layers are oxidized. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. It is noted that this oxidation process may in some embodiments, extend such that the oxidized portion of the epitaxial layer(s) of the stack abuts the sidewall of the gate structure 304.

Figure 6A:
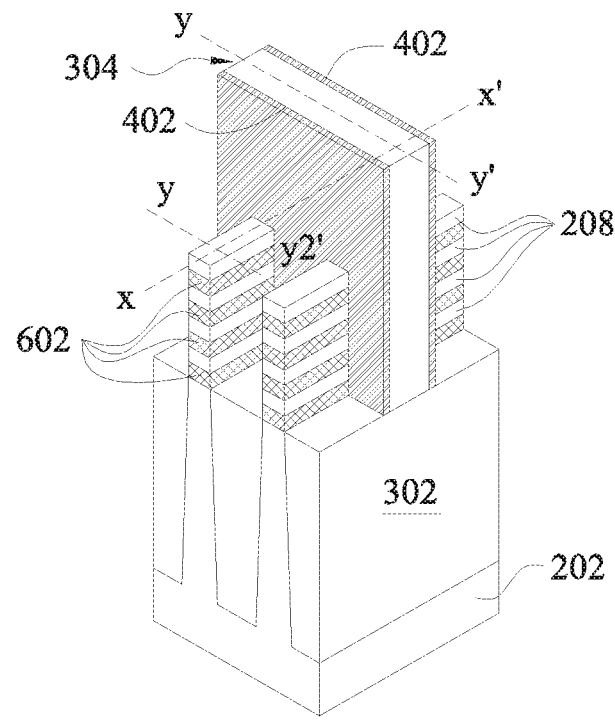
Figure 6B:
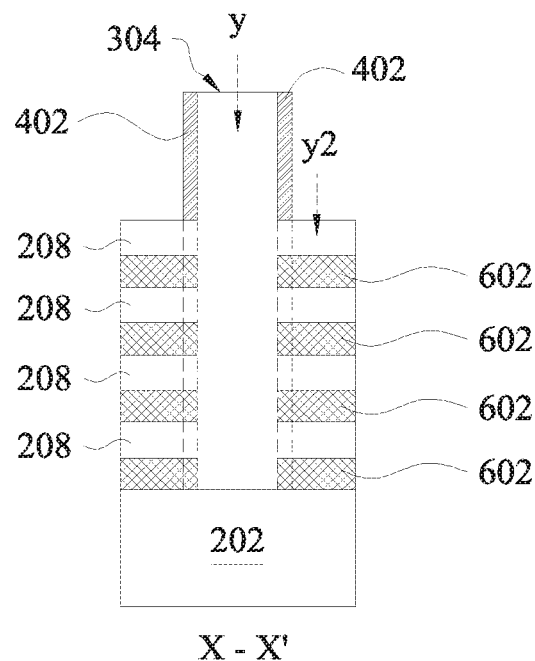
Figure 6C:
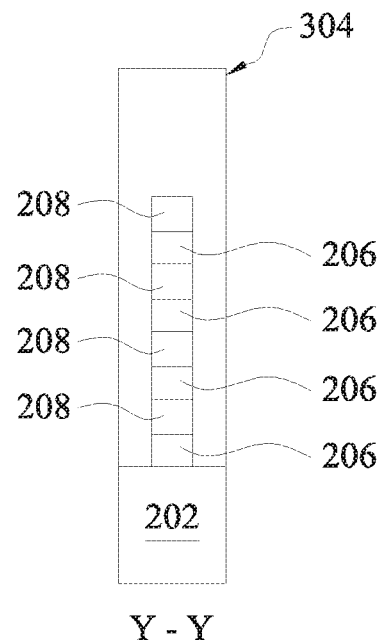
Figure 6D:
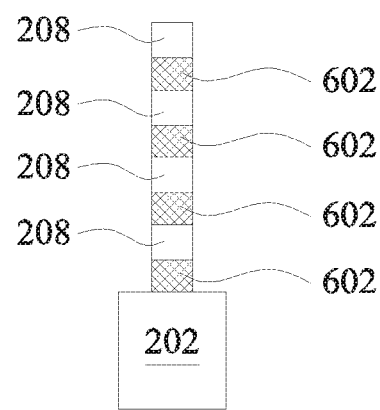

With reference to the example of FIGS. 6A, 6B, and 6D, in an embodiment of block 112, the device 200 is exposed to an oxidation process that fully oxidizes the epitaxial layer 206 of each of the plurality of fin elements 210. The epitaxial layer layers 206 transform into an oxidized layer 602. The oxidized layer 602 extends to the gate structure 304, including, under the spacer elements 402. In some embodiments, the oxidized layer 602 has a thickness range of about 5 to about 25 nanometers (nm). In an embodiment, the oxidized layer 602 may include an oxide of silicon germanium ($SiGeO_x$).

By way of example, in embodiments where the epitaxial layers 206 include SiGe, and where the epitaxial layers portion 208 includes Si, the faster SiGe oxidation rate (i.e., as compared to Si) ensures that the SiGe layer 206 becomes fully oxidized while minimizing or eliminating the oxidization of other epitaxial layers 208. It will be understood that any of the plurality of materials discussed above may be selected for each of the first and second epitaxial layer portions that provide different suitable oxidation rates.

Figure 7A:
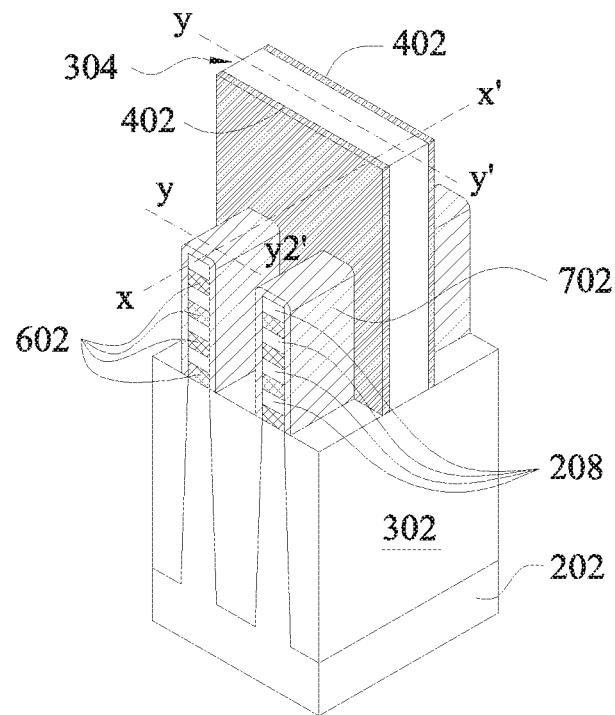
Figure 7B:
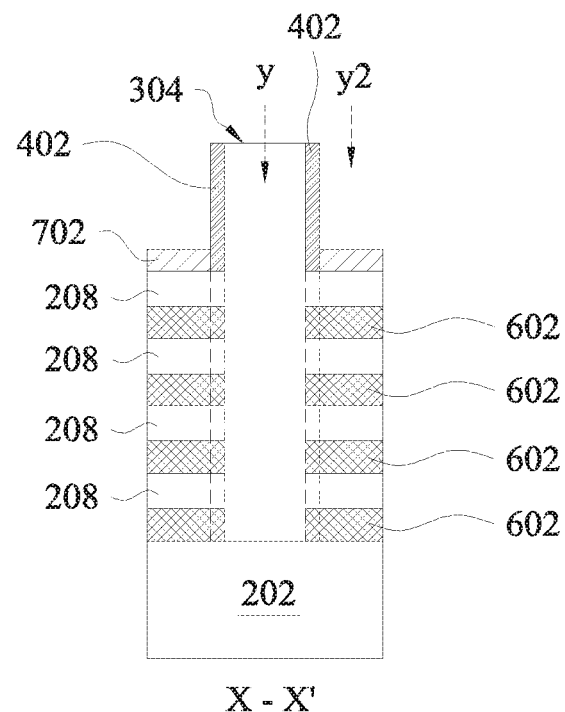
Figure 7C:
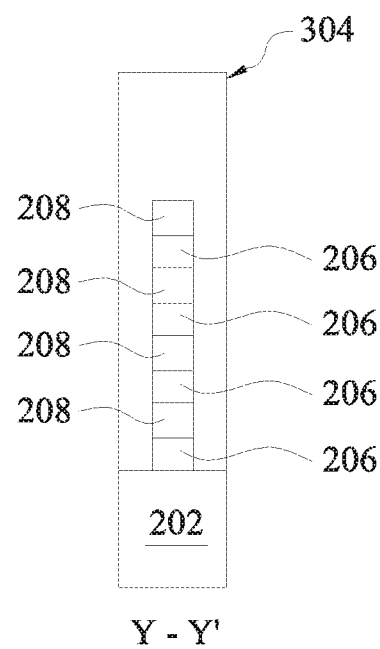
Figure 7D:
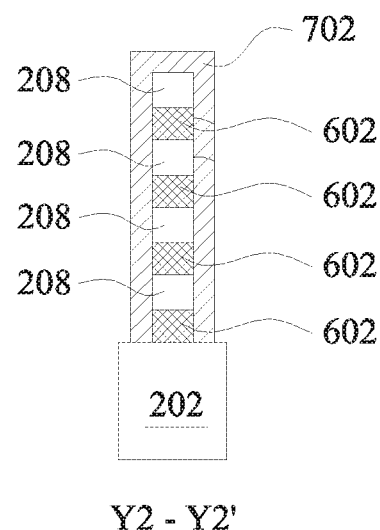

The method 100 then proceeds to block 114 where source/drain features are formed on the substrate. The source/drain features may be formed by performing an epitaxial growth process that provides an epitaxy material on the fin 210 in the source/drain region. In an embodiment, the epitaxy material of the source/drain is formed cladding the portions of the epitaxy layers remaining in the fins' source/drain regions. Referring to the example of FIGS. 7A, 7B, and 7D, source/drain features 702 are formed on the substrate 202 in/on the fin 210 adjacent to and associated with the gate stack 304. The source/drain features 702 include material formed by epitaxially growing a semiconductor material on the exposed epitaxial layer 208 and/or oxidized layer 602. It is noted that the shape of the features 702 is illustrative only and not intended to be limiting; as understood by one of ordinary skill in the art, any epitaxial growth will occur on the semiconductor material (e.g., 208) as opposed to the dielectric material (e.g., 602), the epitaxial growth may be grown such that it merges over a dielectric layer (e.g., over 602) as illustrated, however the straight sidewalls illustrated for example in FIG. 7C are for ease of explanation and may be not required in an actual device.

In various embodiments, the grown semiconductor material of the source/drain 702 may include Ge, Si, GaAs, AlGaAs, SiGe, GaAsP, SiP, or other suitable material. In some embodiments, the material of the source/drain 702 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or both carbon and phosphorous to form SiCP source/drain features. In an embodiment, the epitaxial material of the source/drain 702 is silicon and the layer 208 also is silicon. In some embodiments, the layers 702 and 208 may comprise a similar material (e.g., Si), but be differently doped. In other embodiments, the epitaxy layer for the source/drain 702 includes a first semiconductor material, the epitaxially grown material 208 includes a second semiconductor different than the first semiconductor material. In some embodiments, the epitaxially grown material of the source/drain 702 is not in-situ doped, and, for example, instead an implantation process is performed.

Figure 7E:
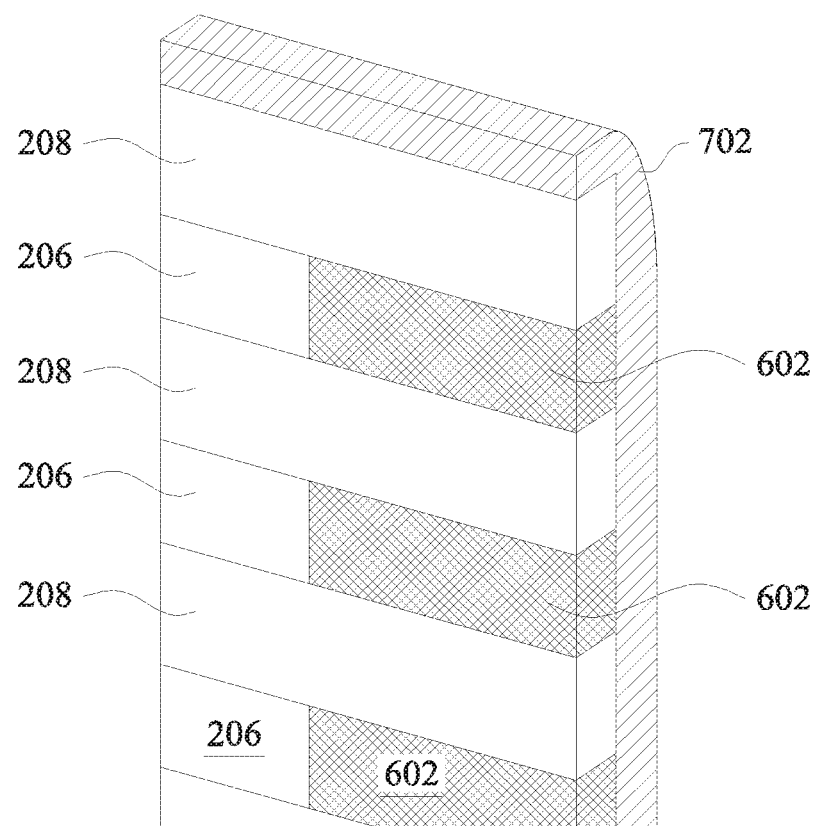
Figure 8A:
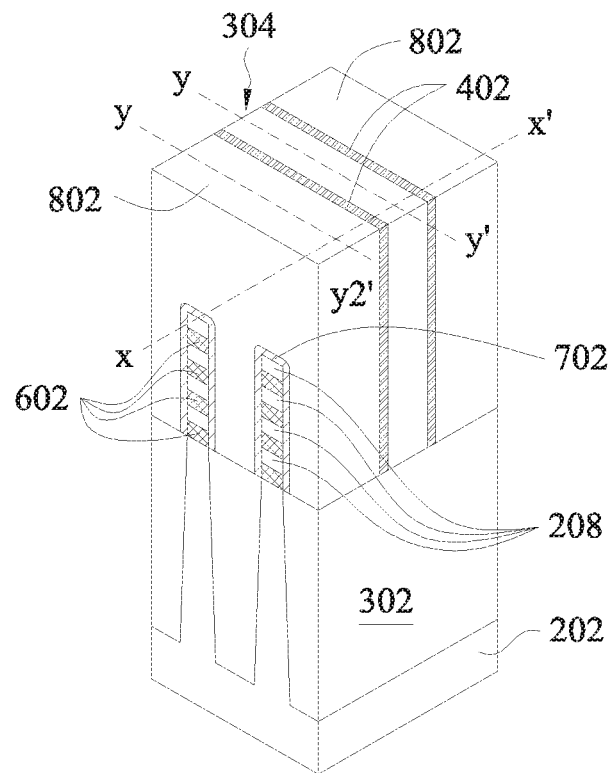
Figure 8B:
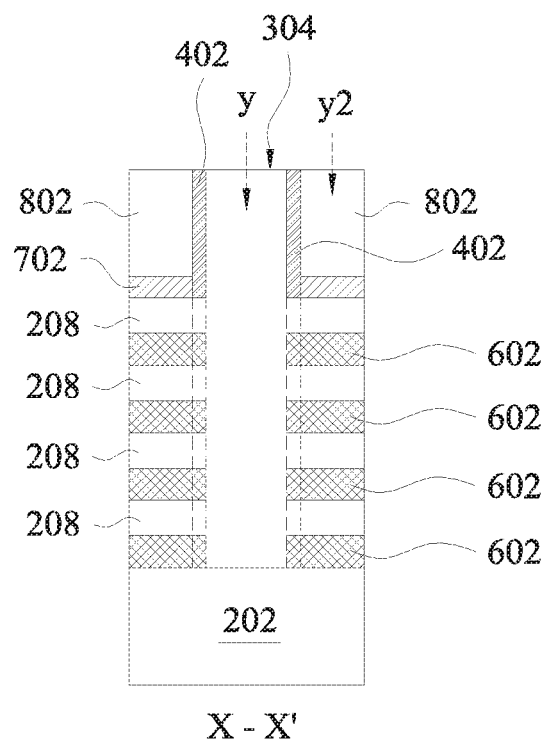
Figure 8C:
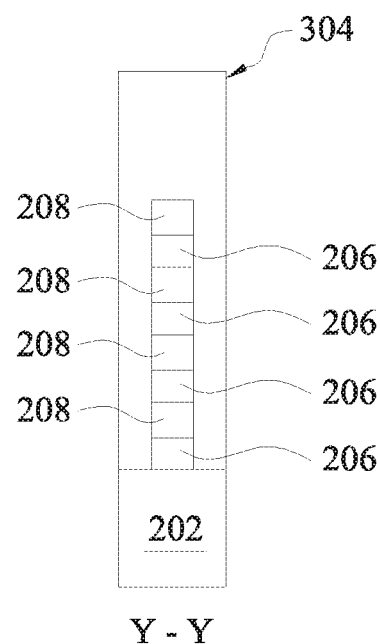
Figure 8D:
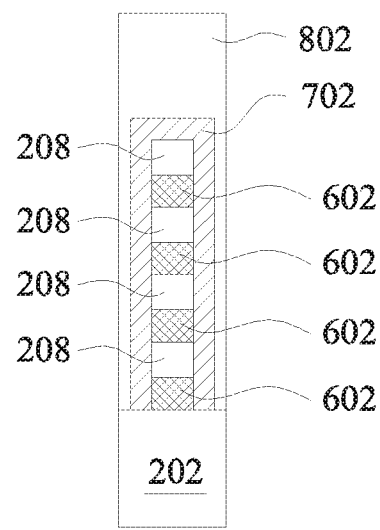

FIG. 7E illustrates a portion of the device 200 at block 114, it is noted that the source/drain region of the device 200 includes the oxidized layer 602 is disposed abutting the epitaxial layer 206 that underlies the gate structure 304. As discussed further below, the epitaxial layer 206 in the channel region (under the gate structure 304, will be removed and the final gate structure formed therein). Thus, the oxidized layer 602 (e.g., SiGeO) is coplanar with gate structure in the source/drain region.

The method 100 then proceeds to block 116 where an inter-layer dielectric (ILD) layer is formed on the substrate. Referring to the example of FIGS. 8A, 8B, and 8D, in an embodiment of block 116, an ILD layer 802 is formed over the substrate 202. In some embodiments, a contact etch stop layer (CESL) is also formed over the substrate 202 prior to forming the ILD layer 802. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 802 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 802 may be deposited by a PECVD process or other suitable deposition technique. In some embodiments, after formation of the ILD layer 802, the semiconductor device 200 may be subject to a high thermal budget process to anneal the ILD layer.

In some examples, after depositing the ILD (and/or CESL or other dielectric layers), a planarization process may be performed to expose a top surface of the gate stack 304. For example, a planarization process includes a chemical mechanical planarization (CMP) process which removes portions of the ILD layer 802 (and CESL layer, if present) overlying the gate stack 304 and planarizes a top surface of the semiconductor device 200.

The method 100 then proceeds to block 118 where the dummy gate (see block 108) is removed. The gate electrode and/or gate dielectric may be removed by suitable etching processes. In some embodiments, block 118 also includes selective removal of the epitaxial layer(s) in the channel region of the device is provided. In embodiments, the selected epitaxial layer(s) are removed in the fin elements within the trench provided by the removal of the dummy gate electrode (e.g., the region of the fin on and over which the gate structure will be formed, or the channel region).

Figure 9A:
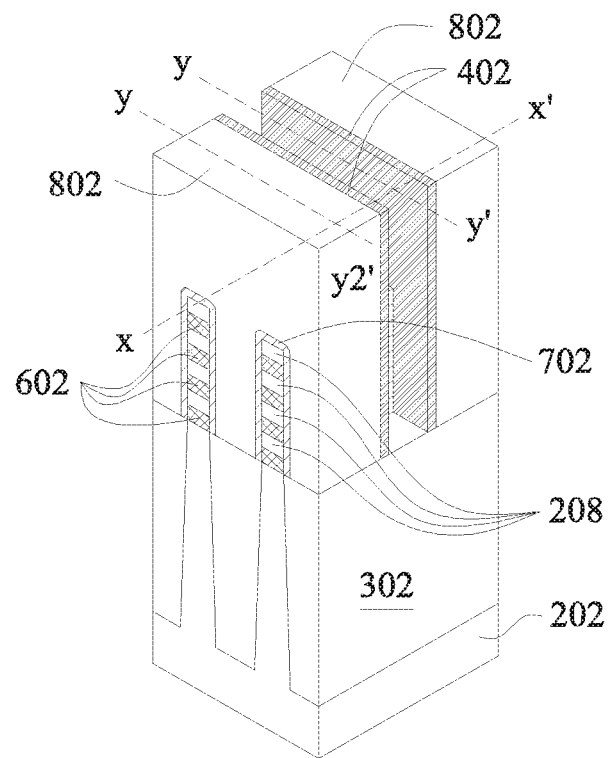
Figure 9B:
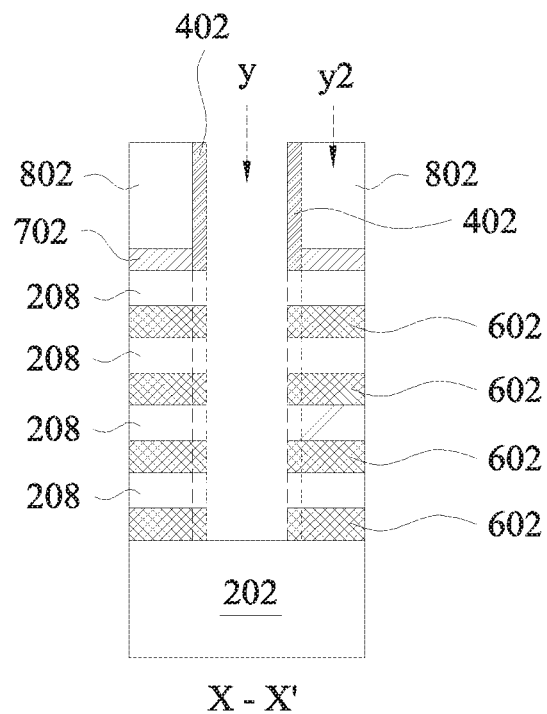
Figure 9C:
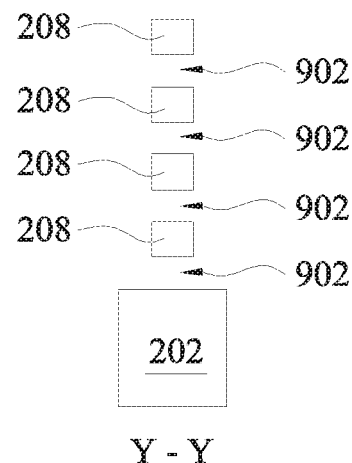
Figure 9D:
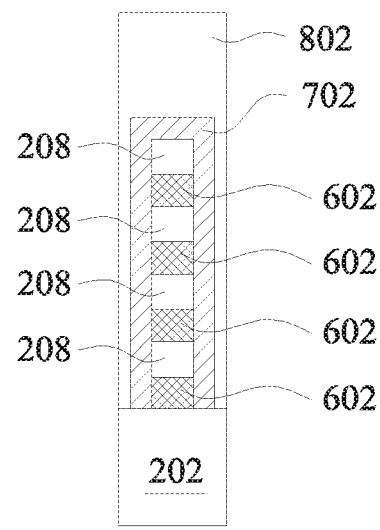

Referring to the example of FIGS. 9A, 9B, and 9C, the epitaxy layers 206 are removed from the channel region of the substrate 202 and within the trench. In some embodiments, the epitaxial layers 206 are removed by a selective wet etching process. In some embodiments, the selective wet etching includes HF. In an embodiment, the epitaxial layers 206 are SiGe and the epitaxial layers 208 are silicon allowing for the selective removal of the SiGe epitaxial layers 206. It is noted that during the interim processing stage of block 118 (e.g., FIG. 9), gaps 902 are provided between the adjacent nanowires in the channel region (e.g., gaps 902 between epitaxy layers 208). The gaps 902 may be filled with the ambient environment conditions (e.g., air, nitrogen, etc).

The method 100 then proceeds to block 120 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region.

Figure 10A:
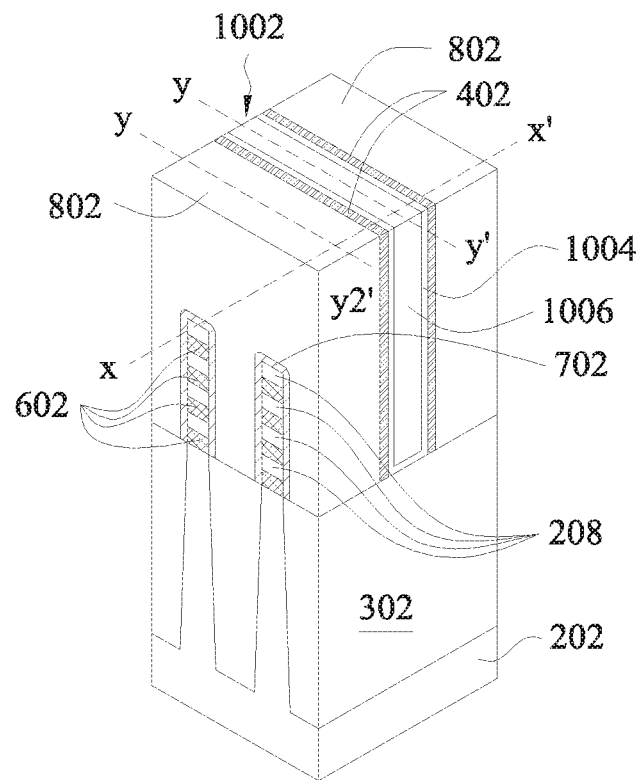
Figure 10B:
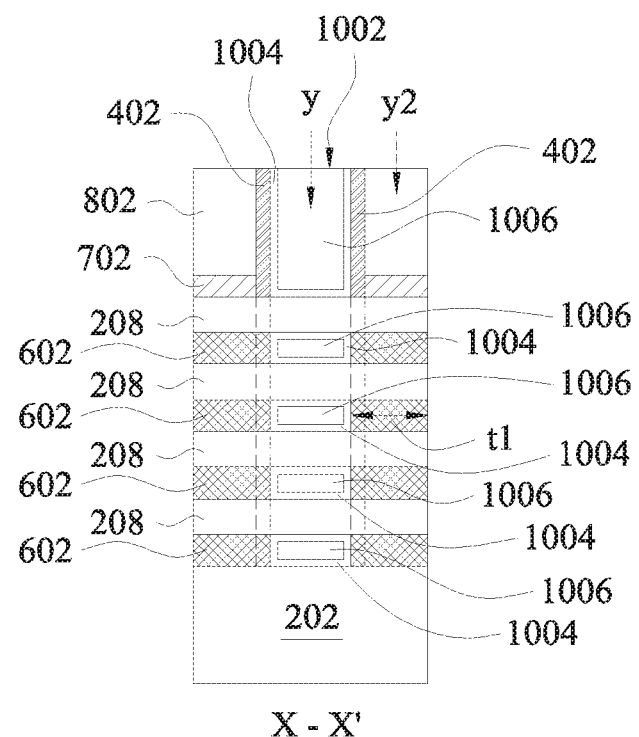
Figure 10C:
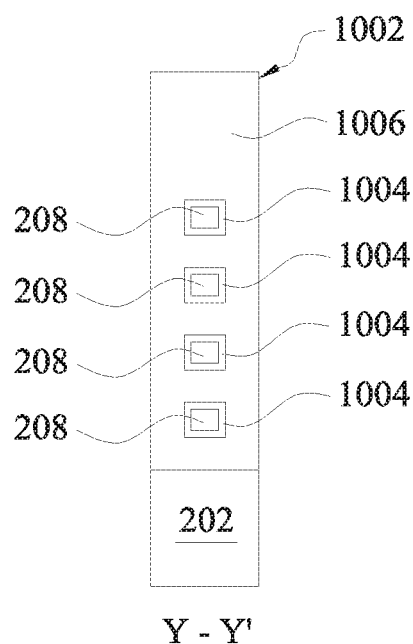
Figure 10D:
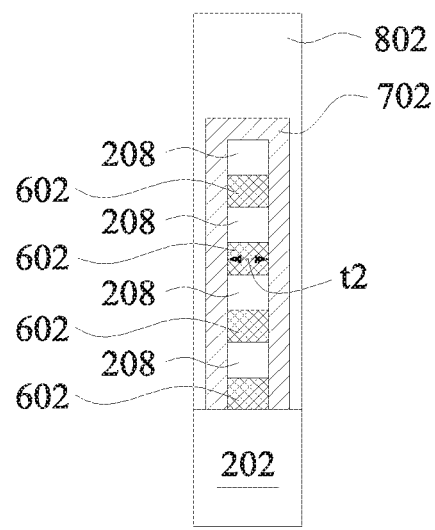

Referring to the example of FIGS. 10A, 10B, and 10C, in an embodiment of block 120, a high-K/metal gate stack 1002 is formed within the trench of the device 200 provided by the removal of the dummy gate and/or release of nanowires, described above with reference to block 118. In various embodiments, the high-K/metal gate stack 1002 includes an interfacial layer, a high-K gate dielectric layer 1004 formed over the interfacial layer, and/or a metal layer 1006 formed over the high-K gate dielectric layer 1004. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1002 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 1004 of the gate stack 1002 may include a high-K dielectric layer such as hafnium oxide ($HfO_2$). Alternatively, the gate dielectric layer 1004 of the gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1002 may be formed by ALD, physical vapor deposition (PVD), CVD, oxidation, and/or other suitable methods. The metal layer of the high-K/metal gate stack 1002 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer of gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1002 may be formed by ALD, PVD, CVD, e-beam evaporation, or other suitable process. Further, the metal layer of the gate stack 1002 may be formed separately for N-FET and P-FET transistors which may use different metal layers. In various embodiments, a CMP process may be performed to remove excessive metal from the metal layer of the gate stack 1002, and thereby provide a substantially planar top surface of the metal layer of the gate stack 1002. The metal layer 1006 of the gate stack 1002 is illustrated in FIGS. 10A, 10B, and 10C. In addition, the metal layer may provide an N-type or P-type work function, may serve as a transistor (e.g., FIN-FET) gate electrode, and in at least some embodiments, the metal layer of the gate stack 1602 may include a polysilicon layer. The gate structure 1002 includes portions that interpose each of the epitaxial layers 306, which each form channels of the multi-gate device 200.

In an embodiment, the oxidized layer 602 provides an inner spacer having a length in the x-direction of t1. t1 may be between approximately 10 nanometers (nm) and approximately 12 nm. The dimension t1 may extend an entire length of the source/drain region. In an embodiment, the oxidized layer 602 provides an inner spacer having a length in the y-direction of t2. t2 may be between approximately 5 nanometers (nm) and approximately 7 nm.

The semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 11:
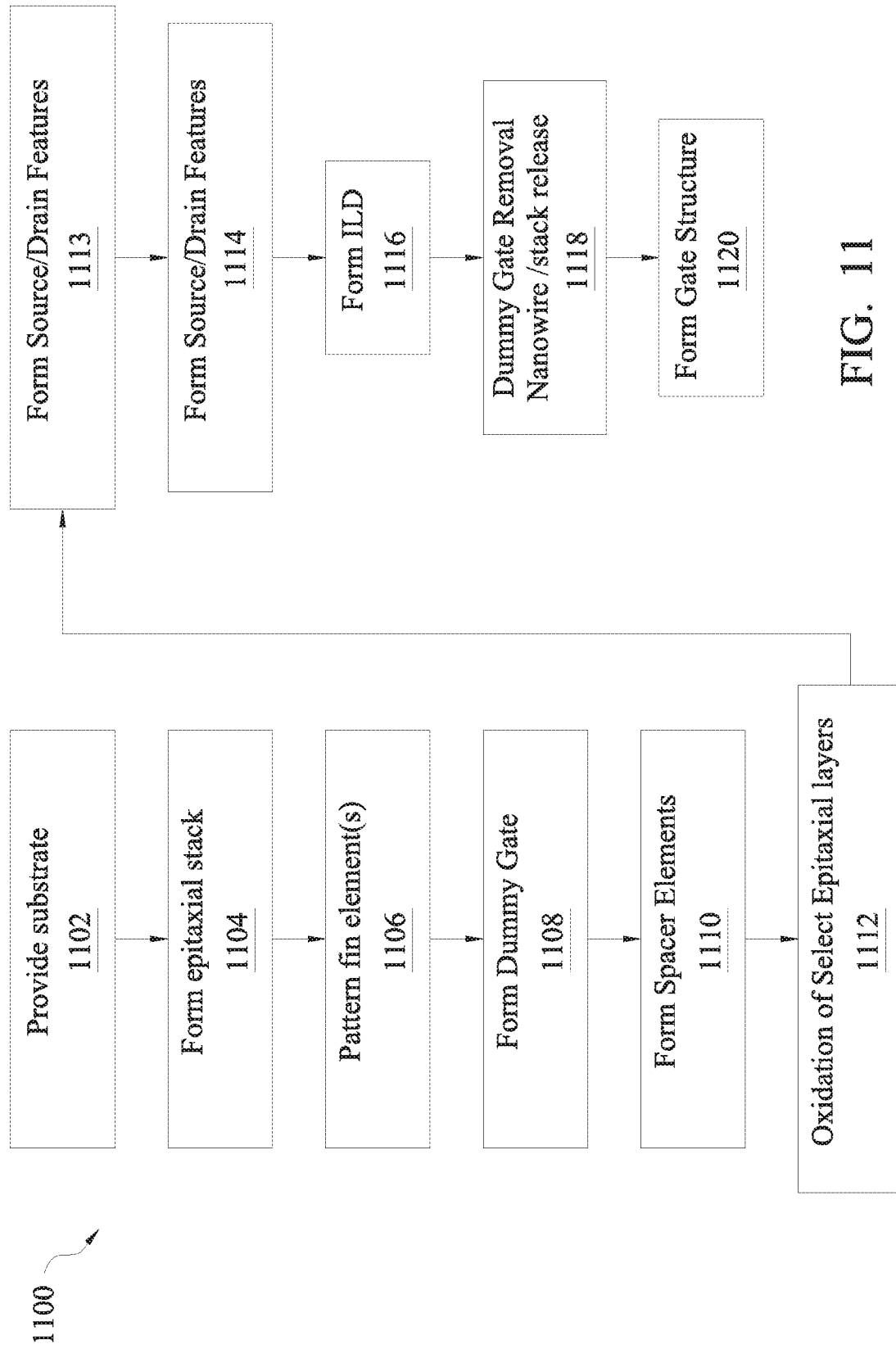
FIG. 11 is a flow chart of another method of fabricating a multi-gate device or portion provided according to one or more aspects of the present disclosure and including an isolation region under the gate.

Referring now to FIG. 11, illustrated is a method 1100 of fabricating a multi-gate device. The method 1100 is substantially similar to the method 100 in many respects and the description of the method 100 above also applies to the method 1100. An embodiment of the method 1100 additionally includes a selective etching of oxidized epitaxial layers prior to forming the source/drain features, as discussed in further detail below.

The example embodiments of the method 1100 are illustrated in FIGS. 2A, 3A, 4A, 5A, 6A, 12A, 13A, 14A, 15A, and 16A as isometric views of an embodiment of a semiconductor device 200 according to various stages of the method 1100. FIGS. 2B, 3B, 4B, 5B, 6B, 12B, 13B, 14B, 15B, and 16B are corresponding cross-sectional side views of an embodiment of a semiconductor device 200 along a first cut X-X'; FIGS. 2C, 3C, 4C, 5C, 6C, 12C, 13C, 14C, 15C, and 16C are corresponding cross-sectional side views of an embodiment of a semiconductor device 200 along a second cut Y-Y' in the channel (gate) region; FIGS. 3D, 4D, 5D, 6D, 12D, 13D, 14D, 15D, and 16D are corresponding cross-sectional side views of an embodiment of a semiconductor device 200 along a third cut Y2-Y2' in the source/drain region.

The method 1100 begins at block 1102 where a substrate is provided. Block 1102 may be substantially similar to block 102, discussed above with reference to them method 100 of FIG. 1. Referring to the example of FIGS. 2A, 2B and 2C, a substrate 202 is provided as discussed above.

The method 1100 proceeds to block 1104 where an epitaxial stack is provided. Block 1104 may be substantially similar to block 104, discussed above with reference to the method 100 of FIG. 1. Referring to the example of FIGS. 2A, 2B and 2C, an epitaxial stack 204 is provided as discussed above.

The method 1100 proceeds to block 1106 where one or more fin elements are provided. Block 1106 may be substantially similar to block 106, discussed above with reference to the method 100 of FIG. 1. Referring to the example of FIGS. 2A, 2B and 2C, a fin element 210 is provided as discussed above.

The method 1100 proceeds to block 1108 where a dummy gate structure is formed. Block 1108 may be substantially similar to block 108, discussed above with reference to the method 100 of FIG. 1. Referring to the example of FIGS. 3A, 3B, 3C and 3D, a gate structure 304 is provided as discussed above.

The method 1100 proceeds to block 1110 where spacer elements are formed. Block 1110 may be substantially similar to block 110, discussed above with reference to the method 100 of FIG. 1. Referring to the example of FIGS. 4A, 4B, 4C and 4D, a spacer material layer 402 is provided as discussed above and as illustrated in FIGS. 5A, 5B, 5C and 5D, the spacer material layer 402 may be etched back.

The method 1100 proceeds to block 1112 where a select oxidation of epitaxial layers of the epitaxial stack is performed. Block 1112 may be substantially similar to block 112, discussed above with reference to the method 100 of FIG. 1. Referring to the example of FIGS. 6A, 6B, 6C and 6D, the epitaxial layers 306 are oxidized to form oxidized layers 602 as discussed above. As discussed above, in an embodiment, the oxidized layers 602 are SiGeO. As also discussed above, the formed oxidized layer 602 may extend to abut the sidewall of the gate structure 304; in other words, the epitaxial layer 308 not directly underling the gate structure 304 is oxidized, including the epitaxial layer 308 underlying the spacer element 402.

Figure 12A:
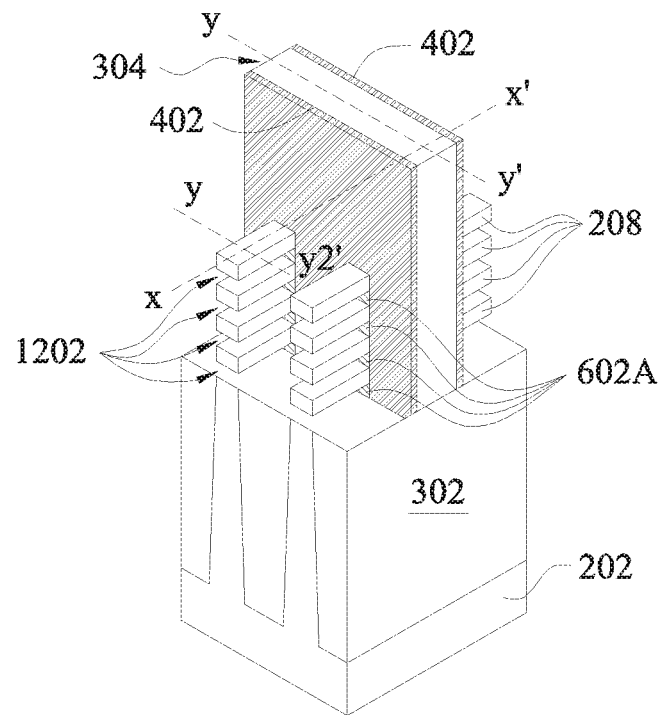
FIGS. 12A, 13A, 13E, 14A, 15A, 16A are isometric views of an embodiment of a device 200 according to aspects of the method of FIG. 11.
Figure 12B:
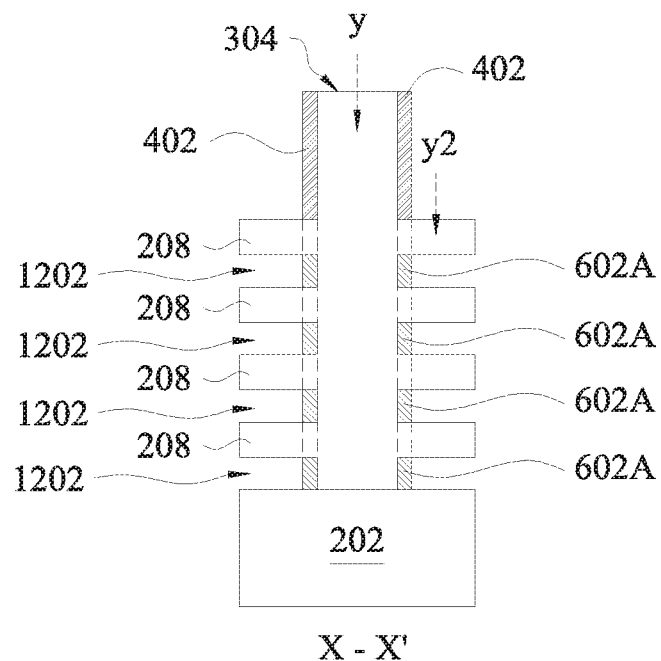
FIGS. 12B, 12C, 12D, 13B, 13C, 13D, 14B, 14C, 14D, 15B, 15C, 15D, 16B, 16C, 16D, are cross-sectional views of an embodiment of a device 200 according to aspects of the method of FIG. 11.
Figure 12C:
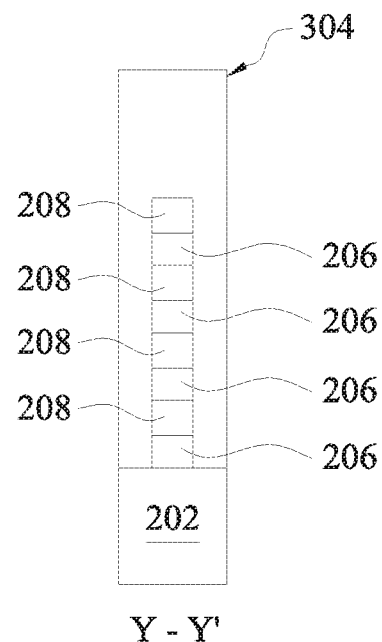
Figure 12D:
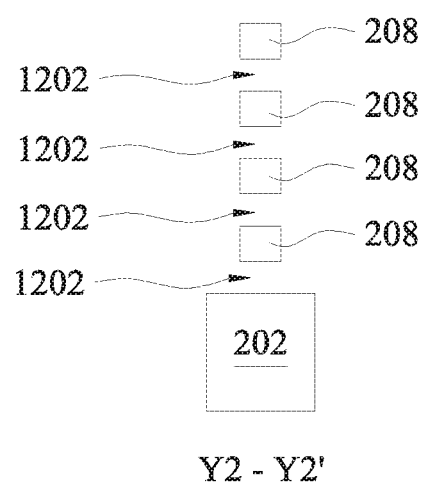

The method 1100 then proceeds to block 1113 where a selective etching process is performed. The selective etching may etch the oxidized layer, discussed above in block 1112. In some embodiments, the oxidized layers are removed from the source/drain region of the fin element(s) (e.g., the region of the fin adjacent the channel region underlying the gate stack). A portion of the oxidized layer directly underlying the spacer element adjacent the gate stack remains on the substrate (e.g., during the etching process the spacer element provides a masking element). As illustrated in FIGS. 12A, 12B, 12C, and 12D, portions of the oxidized epitaxial layers 602 have been removed from the substrate 202 in the source/drain region of the fins 410. FIGS. 12A, 12B, and 12D illustrate gaps 1202 in the place of portions of the oxidized layers 602, while a portion 602A of the oxidized layer (e.g., SiGeO) remains on the substrate. The gaps 1202 may be filled with the ambient environment (e.g., air, $N_2$). In an embodiment, portions of the oxidized layers 602 are removed by a selective wet etching process.

Figure 13A:
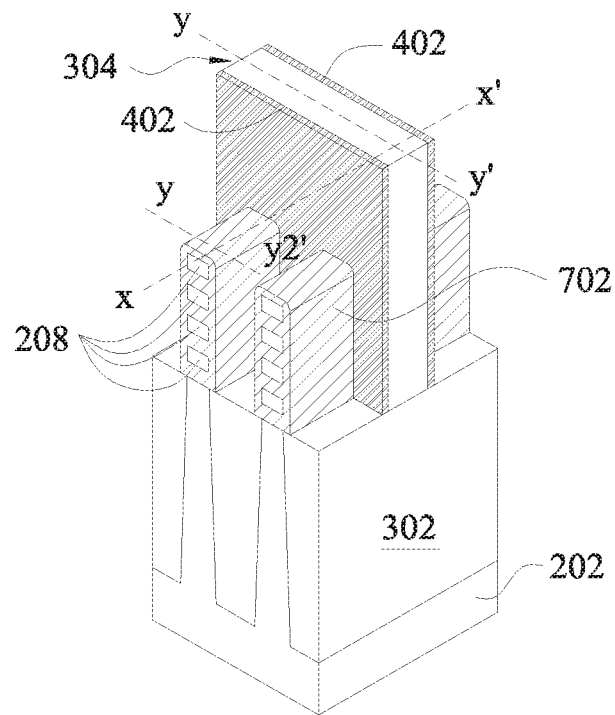
Figure 13B:
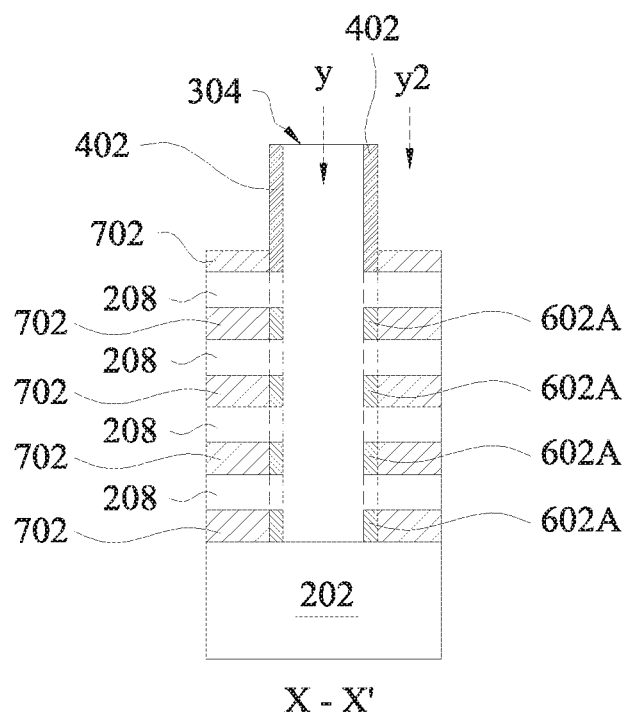
Figure 13C:
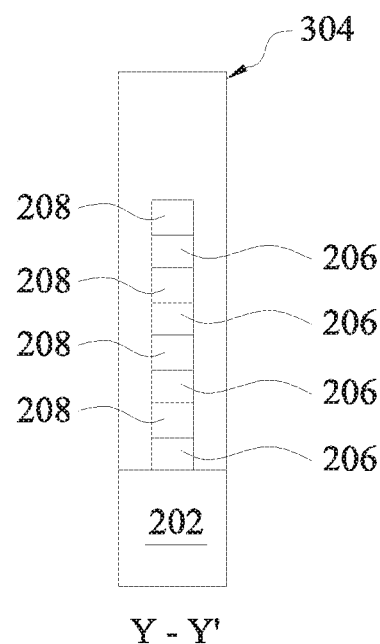
Figure 13D:
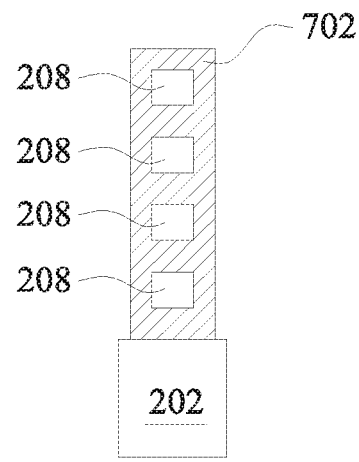

The method 1100 proceeds to block 1114 where a source/drain feature is formed. Block 1114 may include growing an epitaxial layer to form the source/drain feature. Block 1114 may be substantially similar to block 114, discussed above with reference to the method 100 of FIG. 1. Referring to the example of FIGS. 13A, 13B, 13C, and 13D, an epitaxial material source/drain layer 702 is formed as discussed above. In contrast to the above embodiment of the method 100, embodiments of the method 1100 and embodiments of FIG. 13A, 13B, 13D illustrate that the epitaxial material of the source/drain layer 702 is grown on the epitaxial layers 208 that remain in the source/drain region and within the gaps 1202. The source/drain layer 702 abuts the oxidized layer portion 602A and/or the spacer layer 402. Thus, interposing the source/drain layer 702 and the gate stack 304 is the oxidized portion 602A.

Figure 13E:
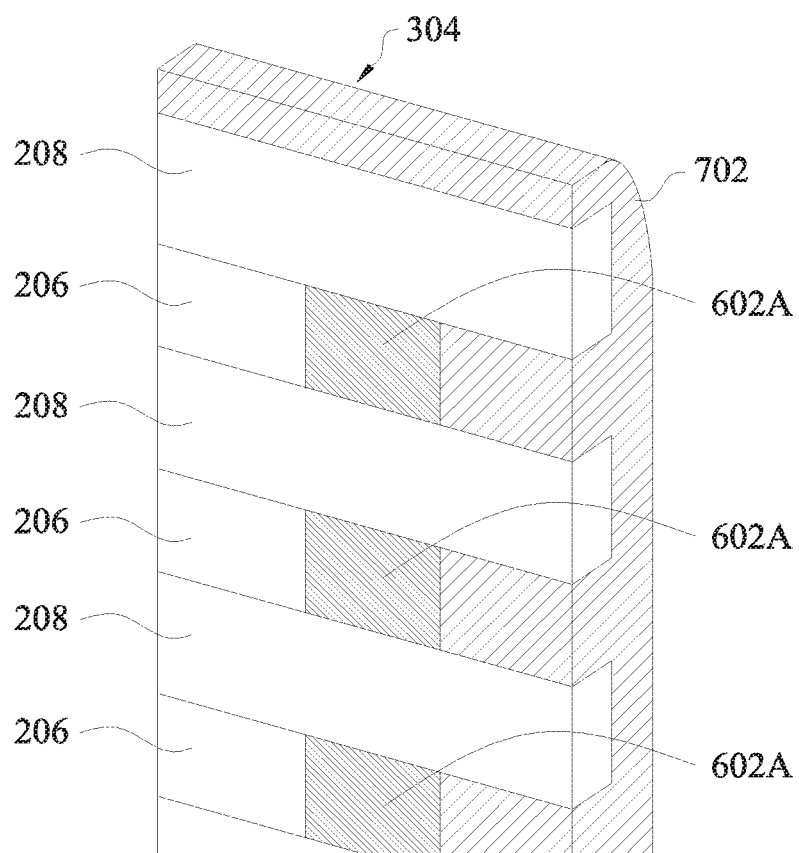
Figure 14A:
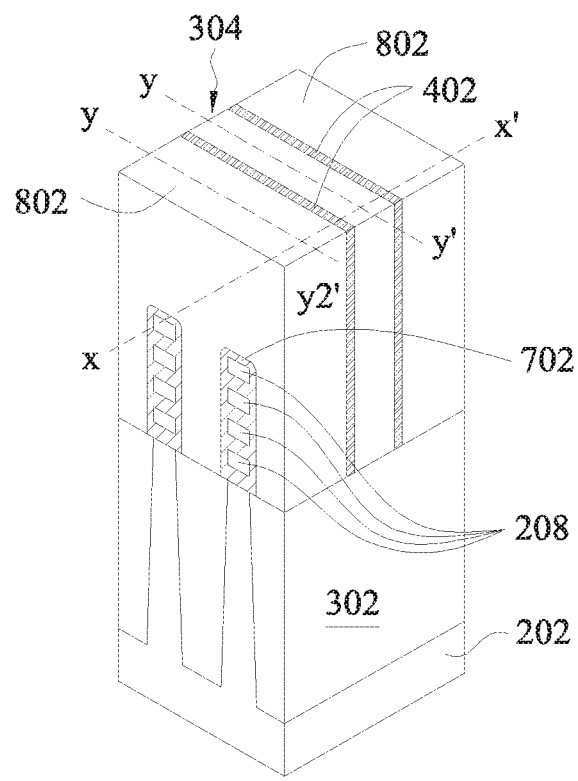
Figure 14B:
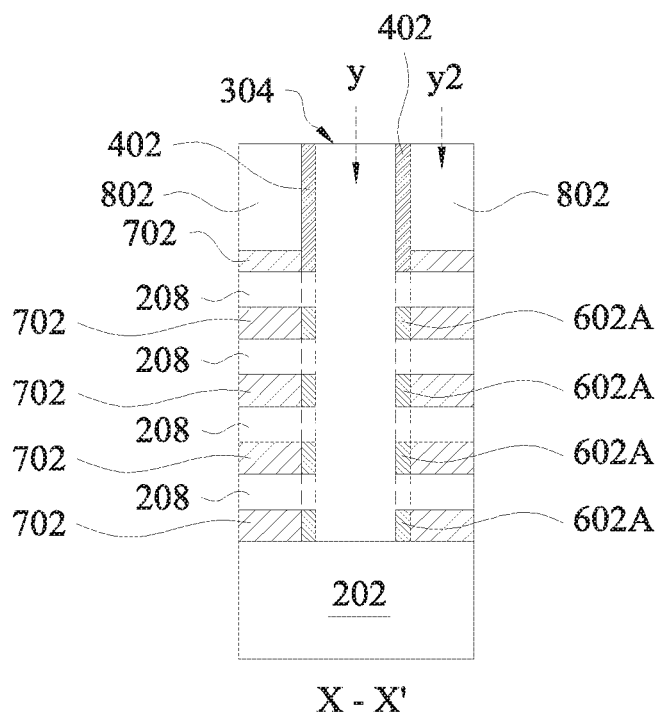
Figure 14C:
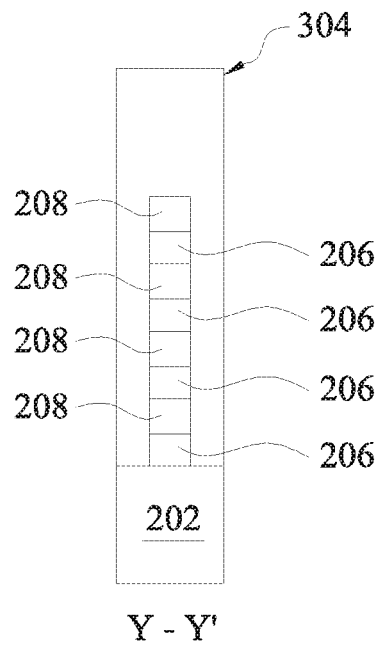
Figure 14D:
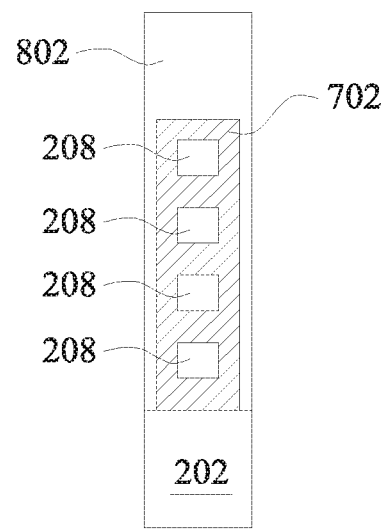
Figure 15A:
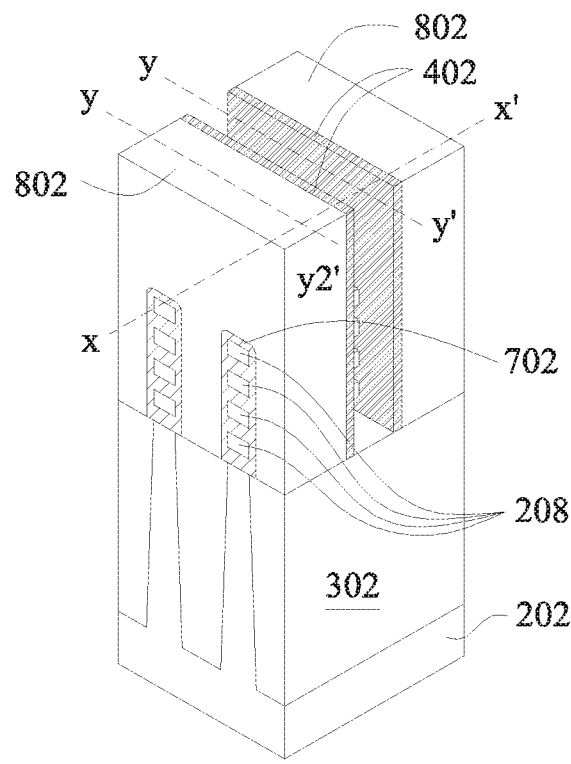
Figure 15B:
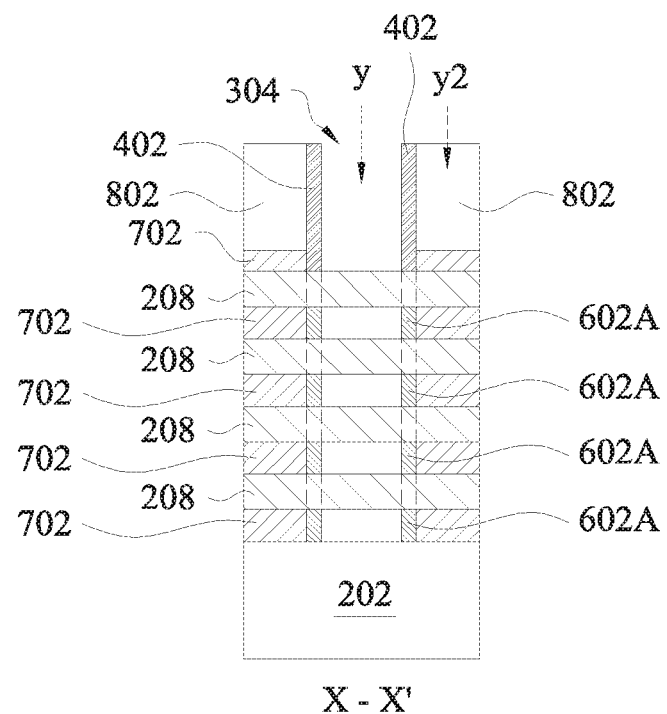
Figure 15C:
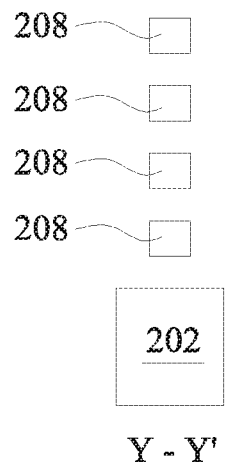
Figure 15D:
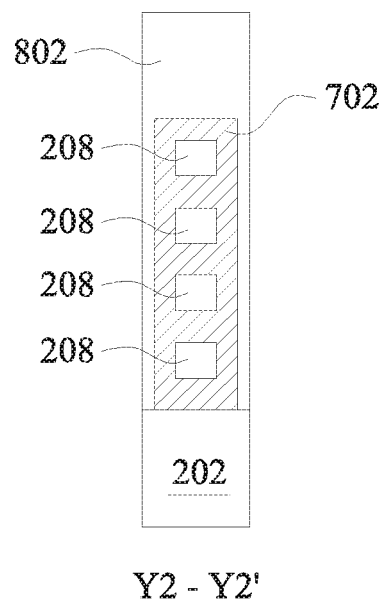
Figure 16A:
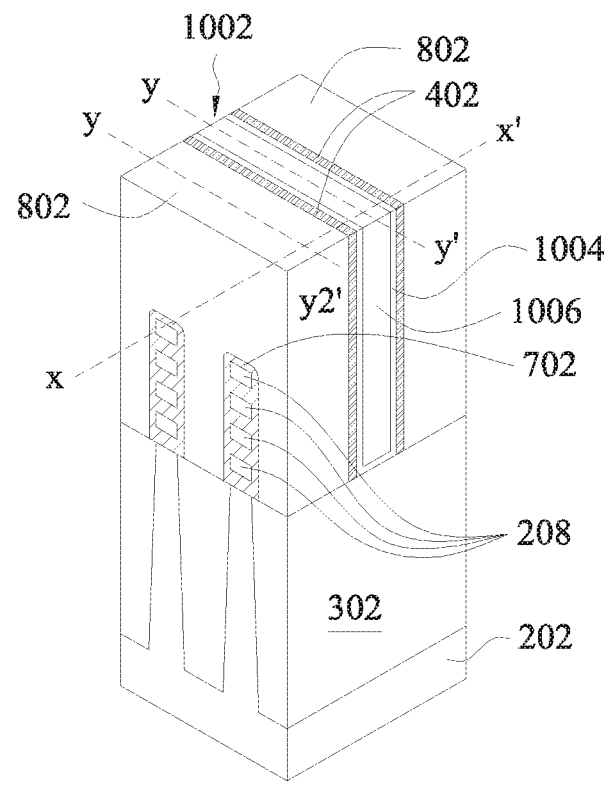
Figure 16B:
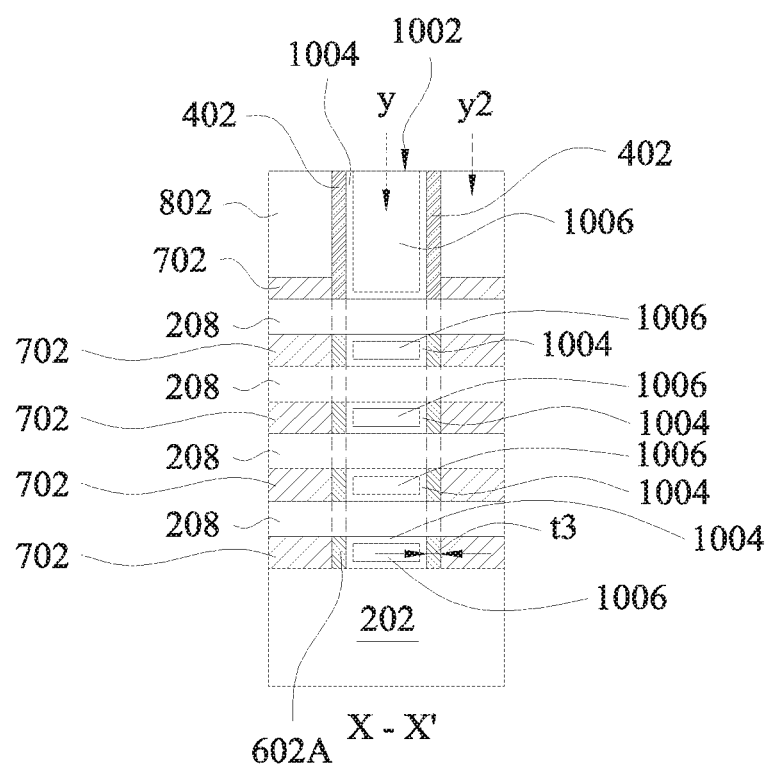
Figure 16C:
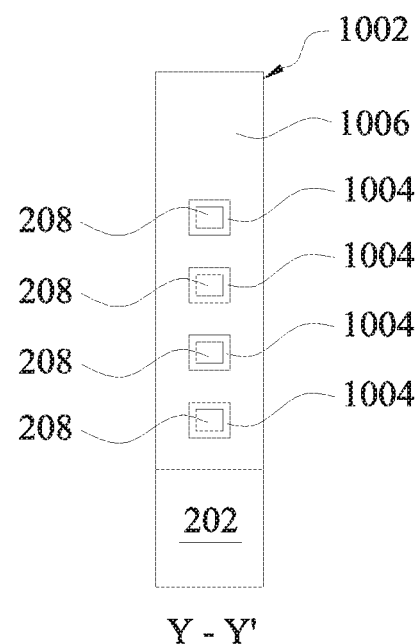
Figure 16D:
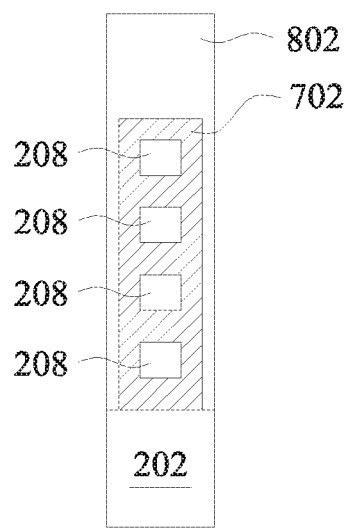

FIG. 13E illustrates a portion of the device 200 at block 1114, it is noted that the source/drain region of the device 200 includes the oxidized layer portion 602A is disposed abutting the epitaxial layer 206 that underlies the gate structure 304. As discussed further below, the epitaxial layer 206 in the channel region (under the gate structure 304, will be removed and the final gate structure formed therein). Thus, the oxidized layer portion 602A is in the source/drain region and coplanar with a portion of the to-be formed gate structure. The oxidized layer portion 602A (e.g., SiGeO) is also coplanar with the source/drain feature 702.

The method 1100 proceeds to block 1116 where an inter-layer dielectric layer is formed. Block 1116 may be substantially similar to block 116, discussed above with reference to the method 100 of FIG. 1. Referring to the example of FIGS. 14A, 14B, 14C and 14D, an ILD layer 802 is formed as discussed above.

The method 1100 proceeds to block 1118 where a dummy gate removal is performed and/or a release of the nanowires of the epitaxial stack in the channel region is performed. Block 1118 may be substantially similar to block 118, discussed above with reference to the method 100 of FIG. 1. Referring to the example of FIGS. 15A, 15B, 15C and 15D, the dummy gate structure 304 is removed to form a trench. Further, the epitaxial layers 208 in the channel region (e.g., under the trench) are also removed "releasing" the nanowires in the channel region (e.g., epitaxial layers 208).

The method 1100 proceeds to block 1120 where a gate structure (e.g., replacement gate structure, high-k metal gate structure) is formed. Block 1120 may be substantially similar to block 120, discussed above with reference to the method 100 of FIG. 1. Referring to the example of FIGS. 16A, 16B, 16C and 16D, a gate structure 1002 is formed including a gate dielectric 1004 and a gate electrode 1006.

In an embodiment, the oxidized layer portion 602A provides an inner spacer having a length in the x-direction of t3. t3 may be between approximately 4 nanometers (nm) and approximately 6 nm. In an embodiment, the oxidized layer 602A provides an inner spacer having a length in the y-direction, which may be between approximately 5 nanometers (nm) and approximately 7 nm.

Figure 17:
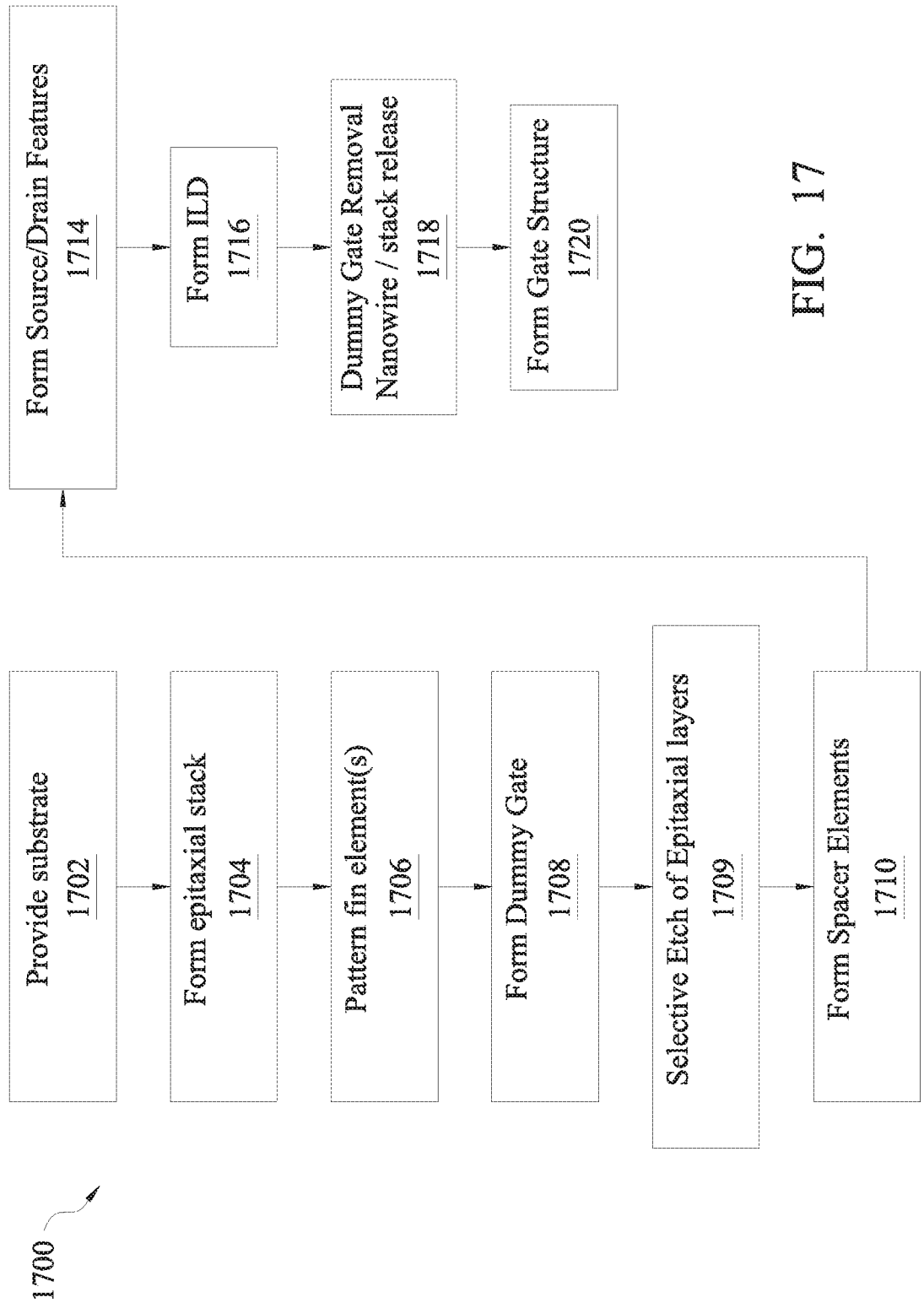
FIG. 17 is a flow chart of another method of fabricating a multi-gate device or portion provided according to one or more aspects of the present disclosure and including an isolation region under the gate.
Figure 18A:
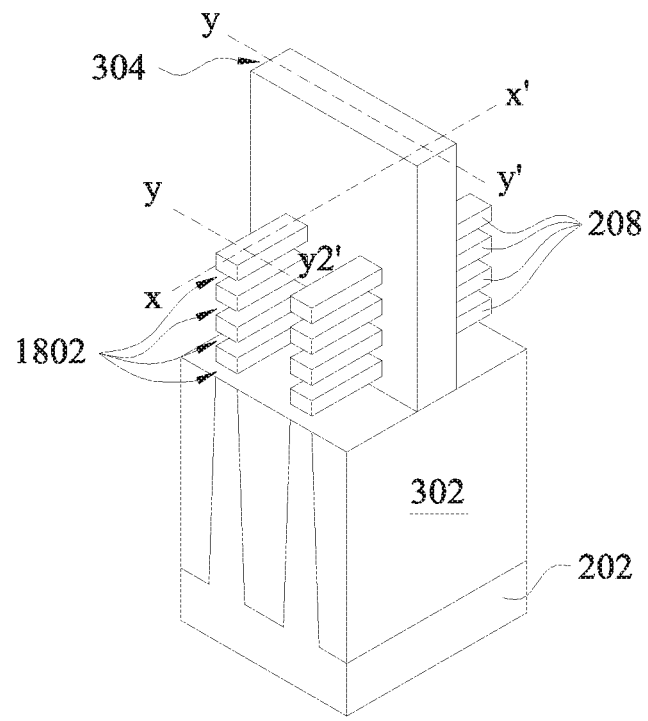
FIGS. 18A, 19A, 20A, 21A, 21E, 22A, 23A, and 24A are isometric views of an embodiment of a device 200 according to aspects of the method of FIG. 11.
Figure 18B:
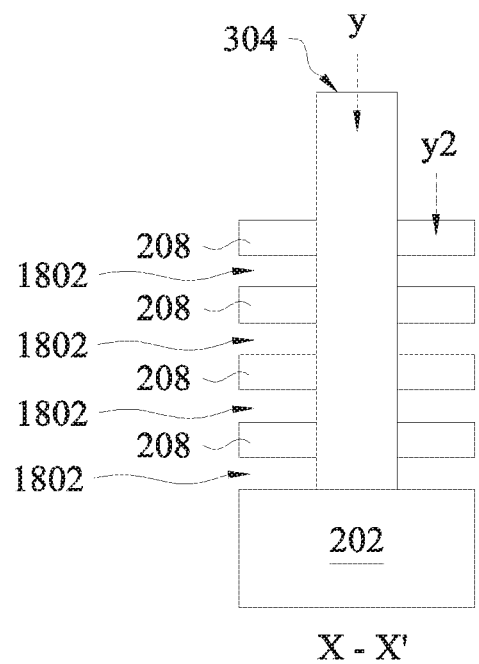
FIGS. 18B, 18C, 18D, 19B, 19C, 19D, 20B, 20C, 20D, 21B, 21C, 21D, 22B, 22C, 22D, 23B, 23C, 23D, 24B, 24C, and 24D are cross-sectional views of an embodiment of a device 200 according to aspects of the method of FIG. 17.
Figure 18C:
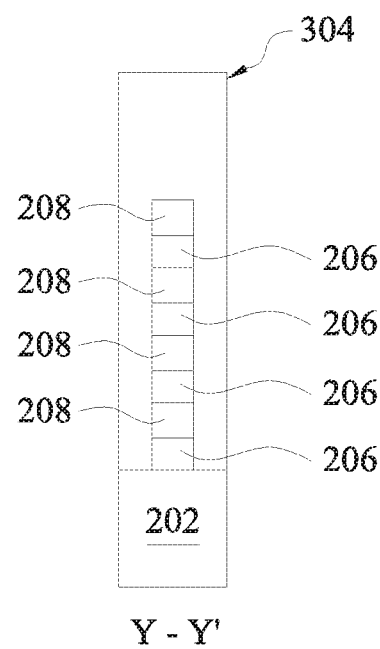
Figure 18D:
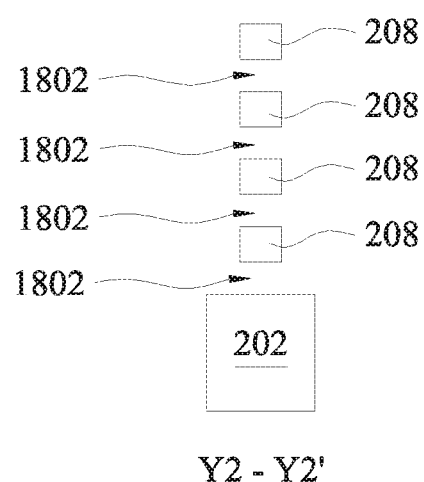
Figure 19A:
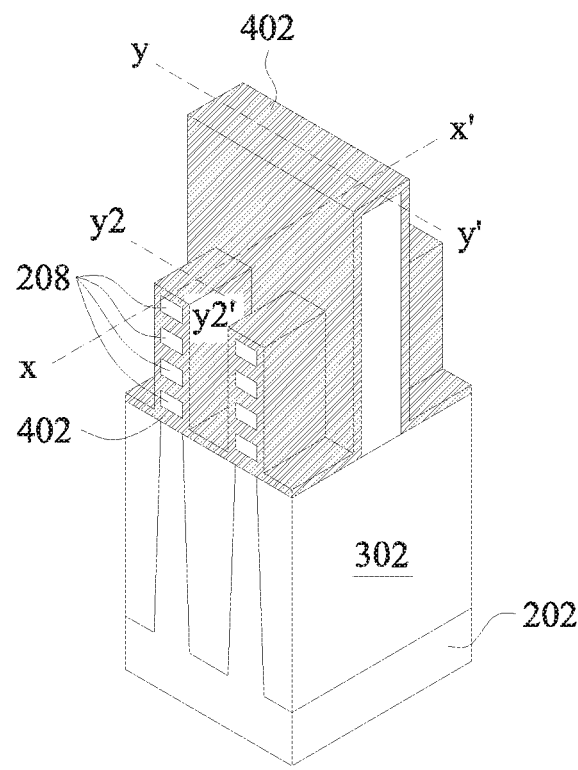
Figure 19B:
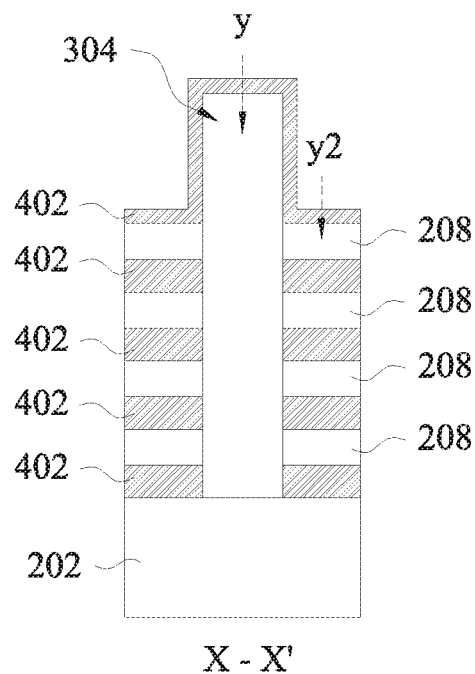
Figure 19C:
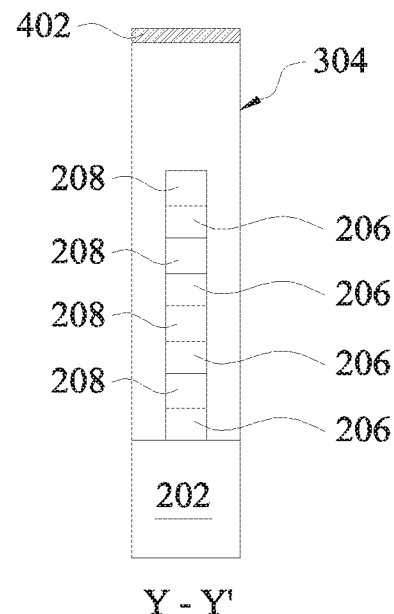
Figure 19D:
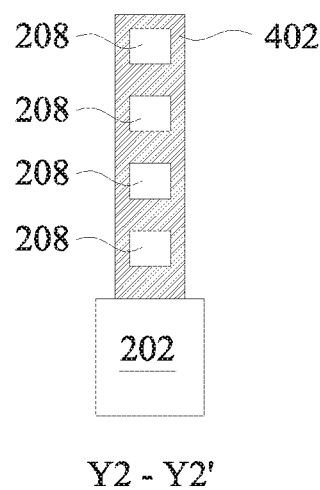
Figure 20A:
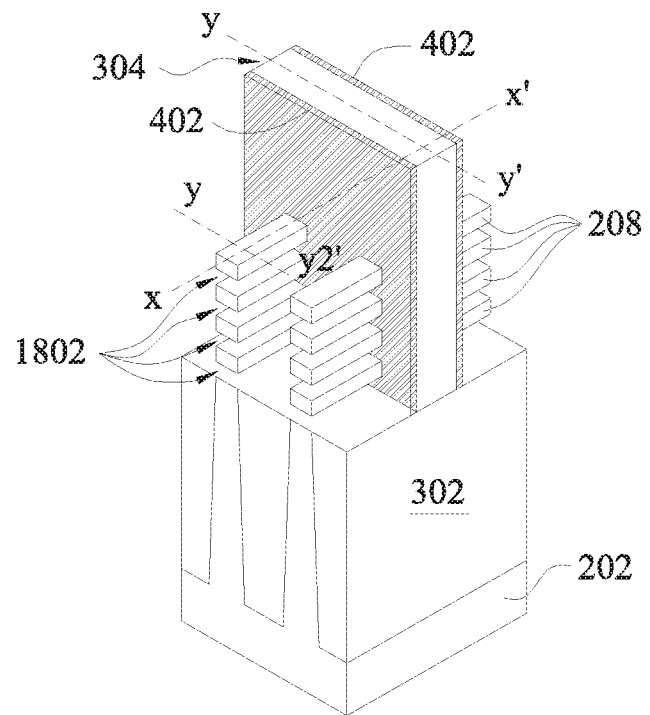
Figure 20B:
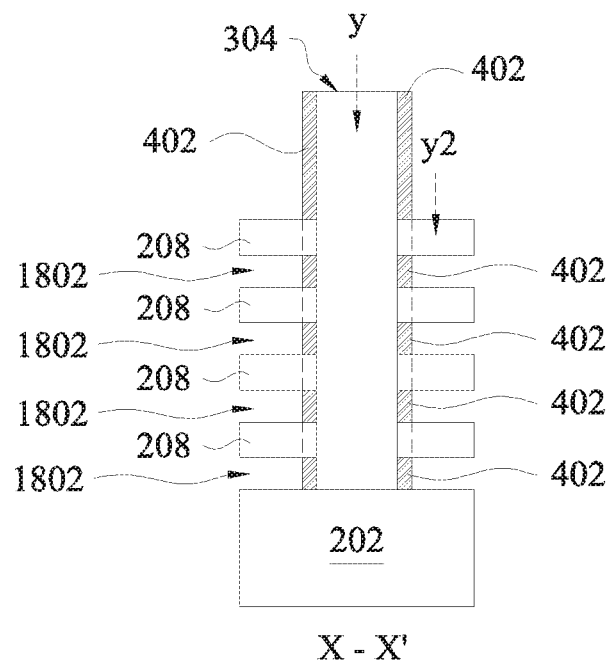
Figure 20C:
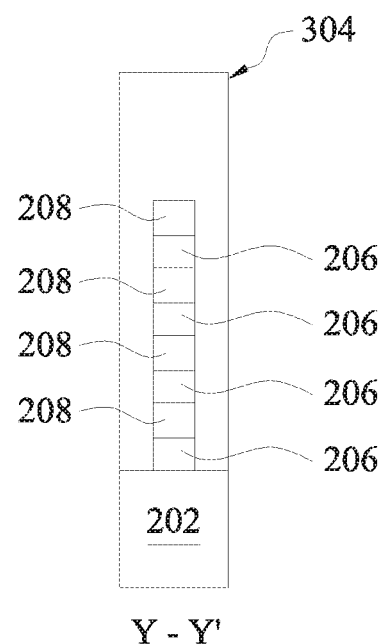
Figure 20D:
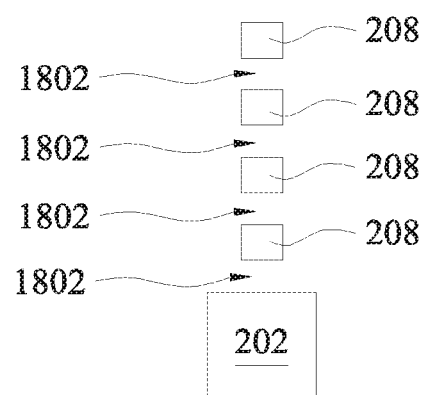

Referring now to FIG. 17, illustrated is a method 1700 of fabricating a multi-gate device. The method 1700 is substantially similar to the method 100 in many respects and the description of the method 100 above also applies to the method 1100. The method 1700 is substantially similar to the method 1100 in many respects and the description of the method 1100 above also applies to the method 1700. An embodiment of the method 1700 additionally includes a selective etching of epitaxial layers prior to forming the spacer material layer.

The example embodiments of the method 1700 are illustrated in FIGS. 2A, 3A, 18A, 19A, 20A, 21A, 21E, 22A, 23A, and 24A are isometric views of an embodiment of a semiconductor device 200 according to various stages of the method 1700. FIGS. 2B, 3B, 18B, 19B, 20B, 21B, 22B, 23B, and 24B are corresponding cross-sectional side views of an embodiment of a semiconductor device 200 along a first cut X-X'; FIGS. 2C, 3C, 18C, 19C, 20C, 21C, 22C, 23C, and 24C are corresponding cross-sectional side views of an embodiment of a semiconductor device 200 along a second cut Y-Y' in the channel (gate) region; FIGS. 3D, 18D, 19D, 20D, 21D, 22D, 23D, and 24D are corresponding cross-sectional side views of an embodiment of a semiconductor device 200 along a third cut Y2-Y2' in the source/drain region.

The method 1700 begins at block 1702 where a substrate is provided. Block 1702 may be substantially similar to block 102, discussed above with reference to the method 100 of FIG. 1. Referring to the example of FIGS. 2A, 2B and 2C, a substrate 202 is provided as discussed above.

The method 1700 proceeds to block 1704 where an epitaxial stack is provided. Block 1704 may be substantially similar to block 104, discussed above with reference to the method 100 of FIG. 1. Referring to the example of FIGS. 2A, 2B and 2C, an epitaxial stack 204 is provided as discussed above.

The method 1700 proceeds to block 1706 where one or more fin elements are provided. Block 1706 may be substantially similar to block 106, discussed above with reference to the method 100 of FIG. 1. Referring to the example of FIGS. 2A, 2B and 2C, a fin element 210 is provided as discussed above.

The method 1700 proceeds to block 1708 where a dummy gate structure is formed. Block 1708 may be substantially similar to block 108, discussed above with reference to the method 100 of FIG. 1. Referring to the example of FIGS. 3A, 3B, 3C and 3D, a gate structure 304 is provided as discussed above.

The method 1700 then proceeds to block 1709 where a selective etch of the epitaxial layers is performed. In an embodiment, a first composition of epitaxial material of the epitaxy stack provided in block 1704 is removed. In a further embodiment, the removed epitaxial layers are SiGe. Referring to the example of FIGS. 18A, 18B, 18C, and 18D, the epitaxial layers 206 have been selectively etched from the source/drain region of the fin 210. In an embodiment, the epitaxial layer 206 is removed except directly under the gate structure 304. FIGS. 18A, 18B, 18C and 18D illustrate gaps 1802 in the place of the epitaxial layers 206 in the source/drain region of the fin 210. The gaps 1802 may extend to the gate structure 304. The gaps 1802 may be filled with the ambient environment (e.g., air, $N_2$). In an embodiment, the epitaxial layer 206 is removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation discussed above may be provided by $O_3$ clean and then SiGeOx remove by an etchant such as $NH_4OH$.

The method 1700 then proceeds to block 1710 where spacer material elements are formed. Block 1710 may be substantially similar to block 110, discussed above with reference to the method 100 of FIG. 1 including depositing a conformal spacer material layer. Referring to the example of FIGS. 19A, 19B, 19C and 19D, a spacer material layer 402 is provided as discussed above is deposited on the substrate 202. On account of creation of gaps 1802, the spacer material layer 402 is formed between the epitaxial layers 208 in the source/drain region. As discussed above, the spacer material layer 402 is a suitable dielectric. Exemplary dielectrics also include SiN, KN1, RN1, SiCN, SiON, and/or other suitable dielectrics, where KN1 is (Si3N4)$_{0.9}$O$_{0.05}$C$_{0.05}$ (SiN doped with 5% Oxygen, 5% Carbon) and RN1 is (Si3N4)$_{0.8}$O$_{0.1}$C$_{0.1}$ (SiN doped with 10% Oxygen, 10% Carbon).

In some embodiments, block 1710 continues to include etch back of the spacer material layer to form spacer elements. The etch back may be substantially similar to as discussed above with reference to block 110 of the method 100 of FIG. 1. Referring to the example of FIGS. 20A, 20B, 20C and 20D, the spacer material layer 402 is etched back to form spacer elements 402 on the sidewalls of the gate structure 304.

The method 1700 proceeds to block 1714 where a source/drain feature is formed. Block 1714 may include growing an epitaxial layer to form the source/drain feature. Block 1714 may be substantially similar to block 114, discussed above with reference to the method 100 of FIG. 1. Referring to the example of FIGS. 21A, 21B, 21C, 21D, and 21E an epitaxial material source/drain layer 702 is formed as discussed above. In contrast to the above embodiment of the method 100, embodiments of the method 1700 and embodiments of FIGS. 21A, 21B, 21C, 21D, and 21E illustrate that the epitaxial material of the source/drain layer 702 is grown on the epitaxial layers 208 that remain in the source/drain region and within the gaps 1802. The epitaxial material may abut the spacer elements 402.

Figure 21A:
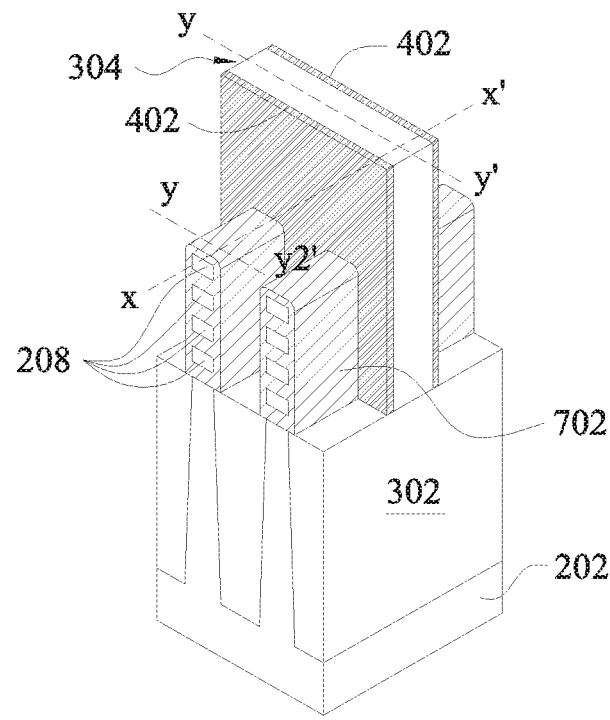
Figure 21B:
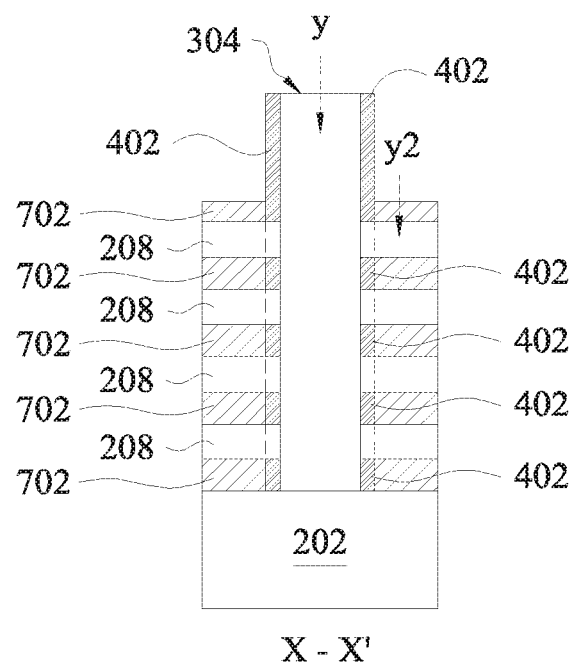
Figure 21C:
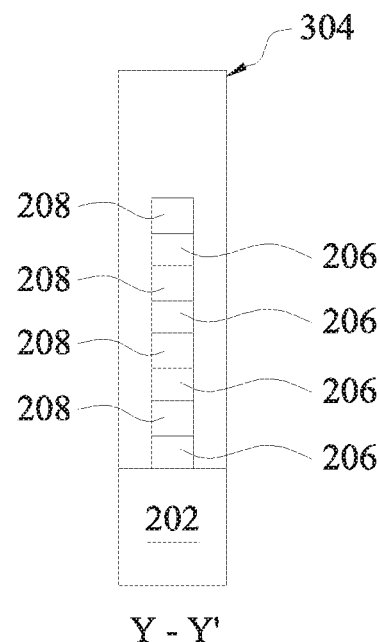
Figure 21D:
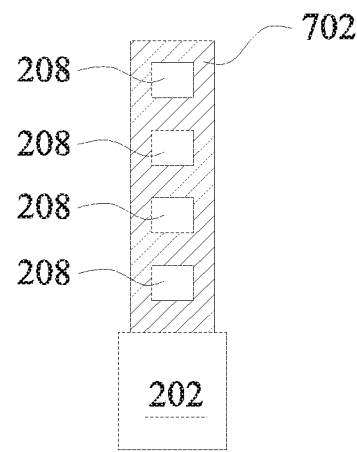
Figure 21E:
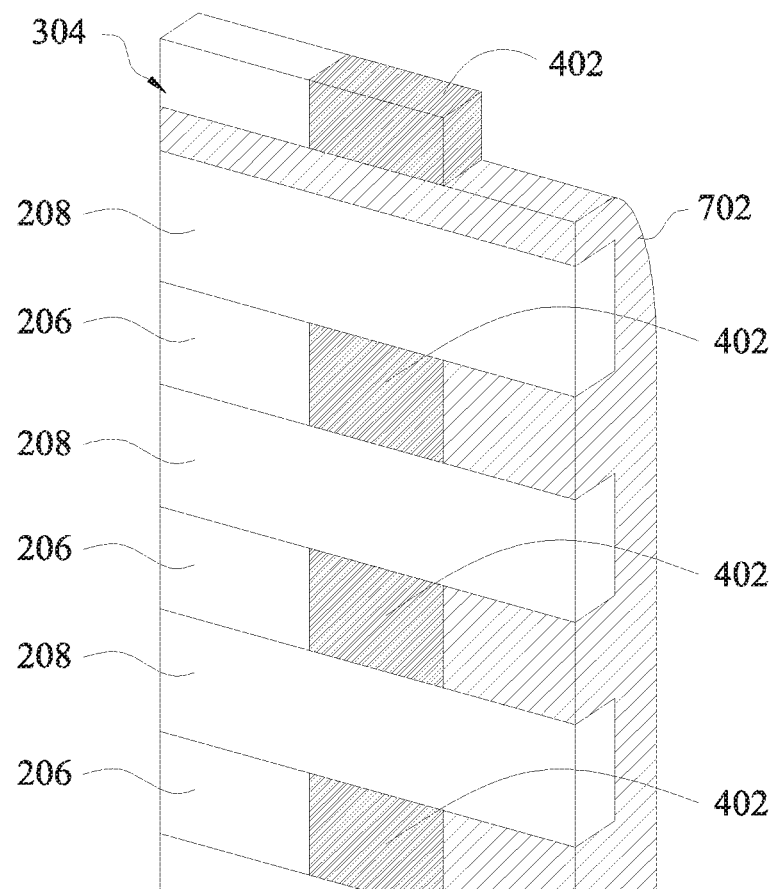
Figure 22A:
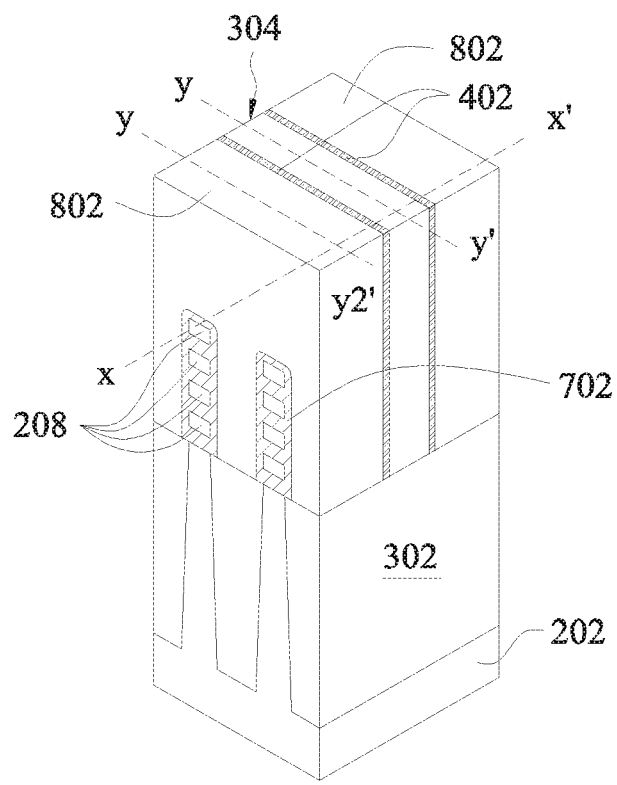
Figure 22B:
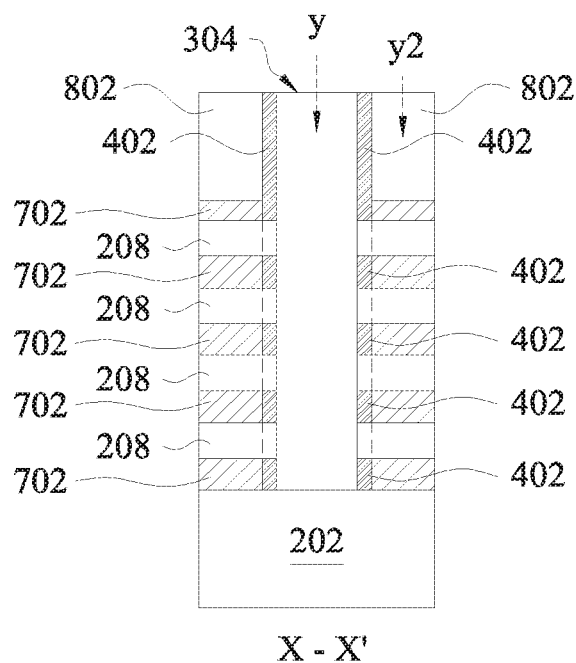
Figure 22C:
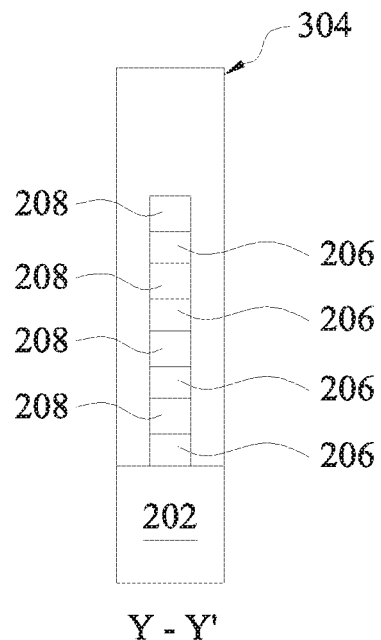
Figure 22D:
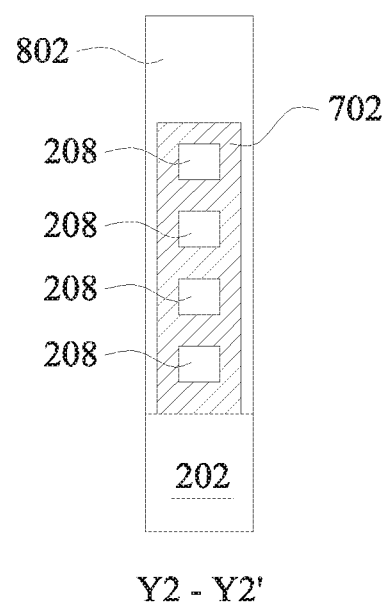
Figure 23A:
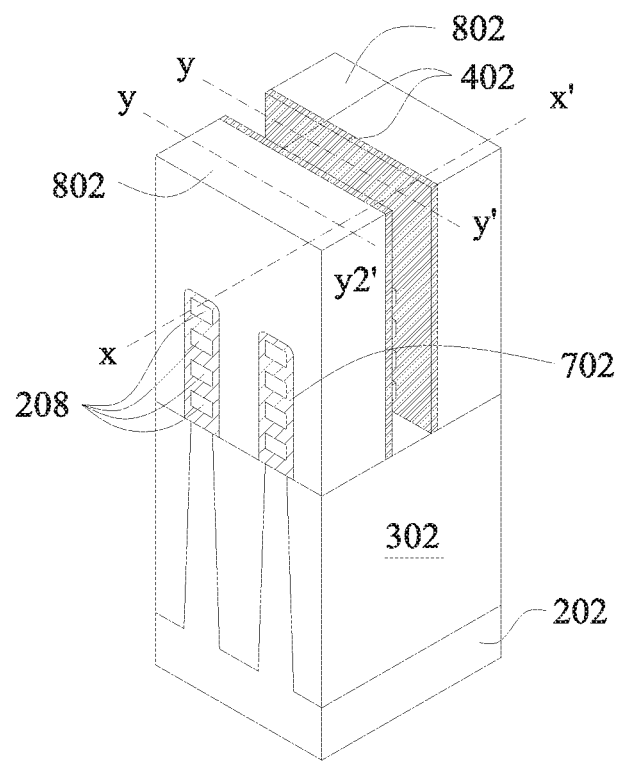
Figure 23B:
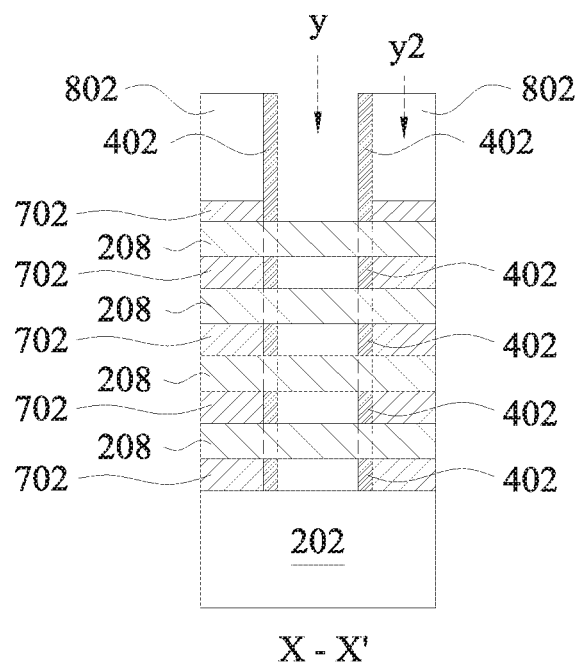
Figure 23C:
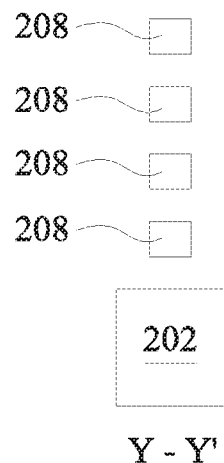
Figure 23D:
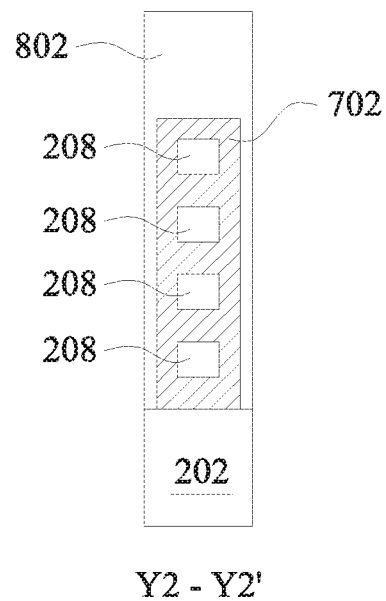
Figure 24A:
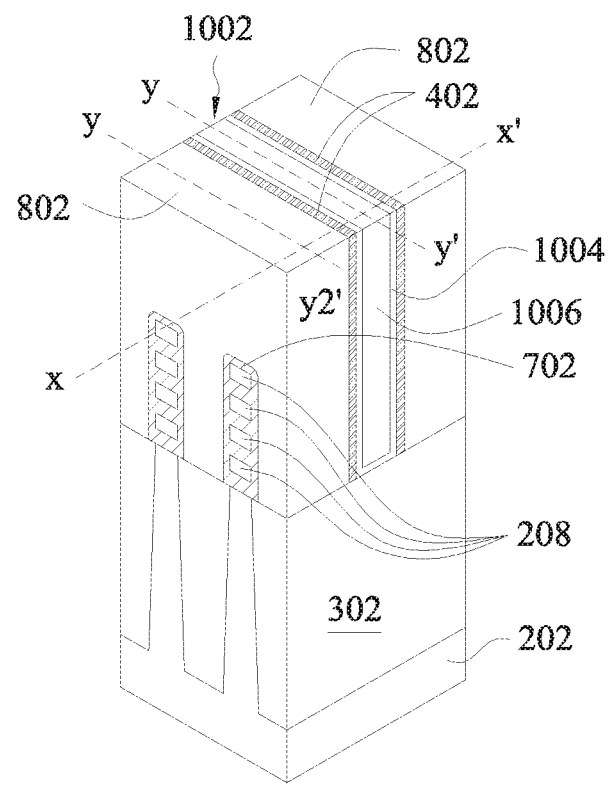
Figure 24B:
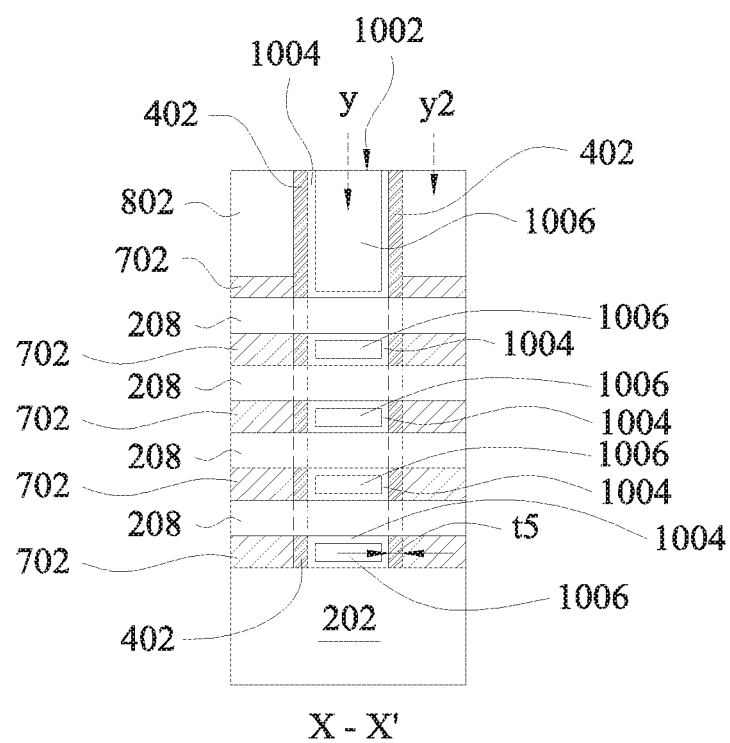
Figure 24C:
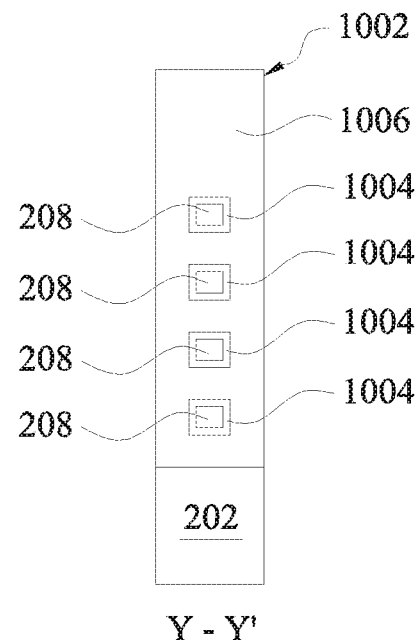
Figure 24D:
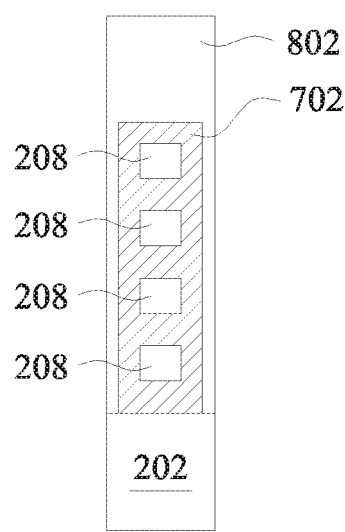

FIG. 21E illustrates a portion of the device 200 at block 1714, it is noted that the source/drain region of the device 200 includes the spacer element 402 is disposed abutting the epitaxial layer 206 that underlies the gate structure 304. As discussed further below, the epitaxial layer 206 in the channel region (under the gate structure 304) will be removed and the final gate structure formed therein. Thus, the spacer element 402 is in the source/drain region and coplanar with a portion of a gate structure. The spacer element 402 is also coplanar with the source/drain feature 702.

The method 1700 proceeds to block 1716 where an inter-layer dielectric layer is formed. Block 1116 may be substantially similar to block 116, discussed above with reference to the method 100 of FIG. 1. Referring to the example of FIGS. 22A, 22B, 22C and 22D, an ILD layer 802 is formed as discussed above.

The method 1700 proceeds to block 1718 where a dummy gate removal is performed and/or a release of the nanowires of the epitaxial stack in the channel region is performed. Block 1718 may be substantially similar to block 118, discussed above with reference to the method 100 of FIG. 1. Referring to the example of FIGS. 23A, 23B, 23C and 23D, the dummy gate structure 304 is removed to form a trench. Further, the epitaxial layers 208 in the channel region (e.g., under the trench) are also removed "releasing" the nanowires in the channel region (e.g., epitaxial layers 208).

The method 1700 proceeds to block 1720 where a gate structure (e.g., replacement gate structure, high-k metal gate structure) is formed. Block 1720 may be substantially similar to block 120, discussed above with reference to the method 100 of FIG. 1. Referring to the example of FIGS. 24A, 24B, 24C and 24D, a gate structure 1002 is formed including a gate dielectric 1004 and a gate electrode 1006.

In an embodiment, the spacer element 402 provides an inner spacer having a length in the x-direction of t4. t4 may be between approximately 4 nanometers (nm) and approximately 6 nm. In an embodiment, the spacer element 402 provides an inner spacer having a length in the y-direction of between approximately 5 nanometers (nm) and approximately 7 nm.

Figure 25:
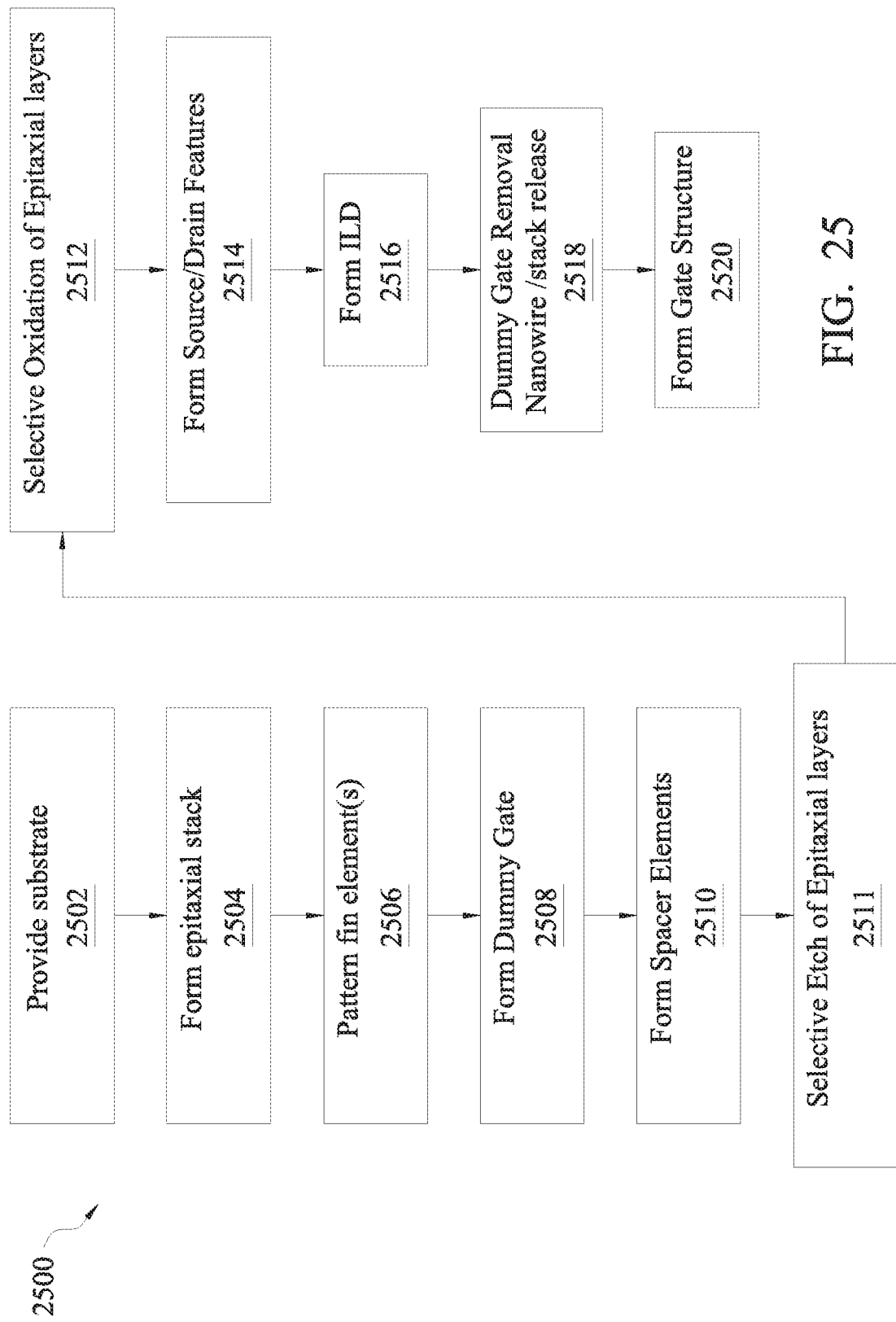
FIG. 25 is a flow chart of another method of fabricating a multi-gate device or portion provided according to one or more aspects of the present disclosure and including an isolation region under the gate.

Referring now to FIG. 25, illustrated is a method 2500 of fabricating a multi-gate device. The method 2500 is substantially similar to the method 100 in many respects and the description of the method 100 above also applies to the method 1100. The method 2500 is substantially similar to the method 1100 and/or the method 1700 in many respects and the description of the method 1100 and/or 1700 above also applies to the method 2500 as appropriate. An embodiment of the method 2500 additionally includes forming a spacer layer before selectively etching and then oxidizing certain epitaxial layers of the epitaxial stack as discussed below.

The example embodiments of the method 2500 are illustrated in FIGS. 2A, 3A, 4A, 5A, 26A, 27A, 28A, 28E, 29A, 30A, and 31A are isometric views of an embodiment of a semiconductor device 200 according to various stages of the method 2500. FIGS. 2B, 3B, 4B, 5B, 26B, 27B, 28B, 29B, 30B, and 31B are corresponding cross-sectional side views of an embodiment of a semiconductor device 200 along a first cut X-X'; FIGS. 2C, 3C, 4C, 5C, 26C, 27C, 28C, 29C, 30C, and 31C are corresponding cross-sectional side views of an embodiment of a semiconductor device 200 along a second cut Y-Y' in the channel (gate) region; FIGS. 3D, 4D, 5D, 26D, 27D, 28D, 29D, 30D, and 31D are corresponding cross-sectional side views of an embodiment of a semiconductor device 200 along a third cut Y2-Y2' in the source/drain region.

The method 2500 begins at block 2502 where a substrate is provided. Block 2502 may be substantially similar to block 102, discussed above with reference to the method 100 of FIG. 1. Referring to the example of FIGS. 2A, 2B and 2C, a substrate 202 is provided as discussed above.

The method 2500 proceeds to block 2504 where an epitaxial stack is provided. Block 2504 may be substantially similar to block 104, discussed above with reference to the method 100 of FIG. 1. Referring to the example of FIGS. 2A, 2B and 2C, an epitaxial stack 204 is provided as discussed above.

The method 2500 proceeds to block 2506 where one or more fin elements are provided. Block 2506 may be substantially similar to block 106, discussed above with reference to the method 100 of FIG. 1. Referring to the example of FIGS. 2A, 2B and 2C, a fin element 210 is provided as discussed above.

The method 2500 proceeds to block 2508 where a dummy gate structure is formed. Block 2508 may be substantially similar to block 108, discussed above with reference to the method 100 of FIG. 1. Referring to the example of FIGS. 3A, 3B, 3C and 3D, a gate structure 304 is provided as discussed above.

The method 2500 then proceeds to block 2510 where spacer elements are formed. Block 2510 may be substantially similar to block 110, discussed above with reference to the method 100 of FIG. 1 including depositing a conformal spacer material layer. Referring to the example of FIGS. 4A, 4B, 4C, and 4D, a spacer material layer 402 is deposited on the substrate 202. As discussed above with reference to the method 100, the spacer material layer 402 is a suitable dielectric. Block 2510 may include etching back the spacer material.

The spacer material layer may be a conformal layer (see, e.g., FIG. 4) that is subsequently etched back to form spacer elements (see, e.g., FIG. 5). In some embodiments, the deposition of the spacer material layer is followed by an etching back (e.g., anisotropically) the dielectric spacer material. Referring to the example, with reference to the example of FIGS. 5A, 5B, 5C, and 5D, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A, 5B, and 5D. The spacer layer 402 may be removed from a top surface of the gate stack 304, as illustrated in FIG. 5C.

The method 2500 then proceeds to block 2511 where a selective etch of the epitaxial layers is performed. In an embodiment, a first composition of epitaxial material of the epitaxy stack provided in block 2504 is removed. In a further embodiment, the removed epitaxial layers are SiGe. Referring to the example of FIGS. 26A, 26B, 26C, and 26D, the epitaxial layers 206 have been selectively etched from the source/drain region of the fin 210. FIGS. 26A, 26B, 26C, and 26D illustrate gaps 2602 in the place of portions of the epitaxial layers 206 in the source/drain region of the fin 210. The gaps 2602 may be filled with the ambient environment (e.g., air, $N_2$). In an embodiment, the portions of the epitaxial layers 206 are removed by a selective wet etching process. In some embodiments, the selective wet etching includes an APM etch (e.g., ammonia hydroxide-hydrogen peroxide-water mixture). Thus, it is noted that the gaps 2602 do not abut the sidewall of the gate structure 304 on account of the spacer element 402 protecting the epitaxial layer 206A from removal abutting the gate structure 304. This is illustrated as epitaxial layer portion 206A.

Figure 26A:
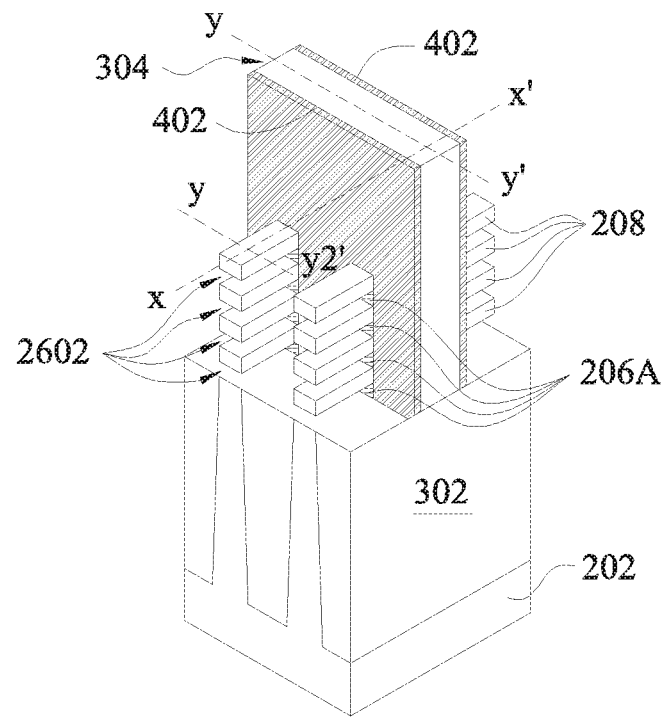
FIGS. 26A, 27A, 28A, 28E, 29A, 30A, 31A, are isometric views of an embodiment of a device 200 according to aspects of the method of FIG. 25.
Figure 26B:
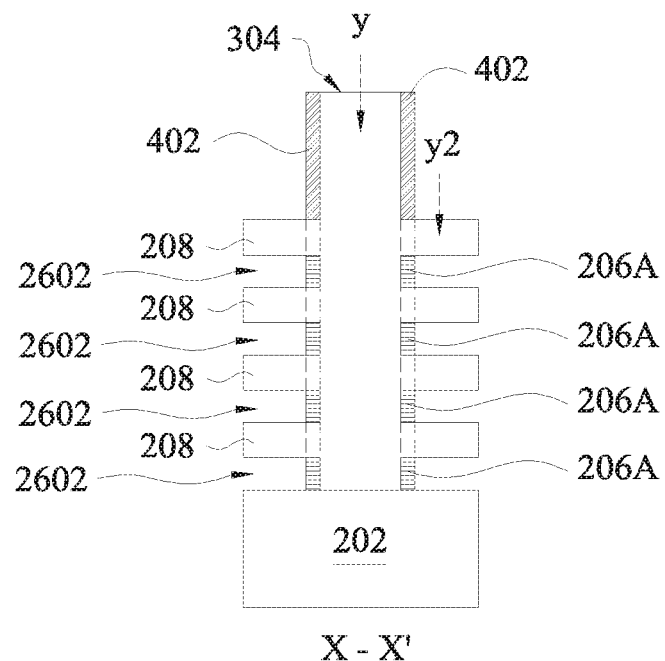
FIGS. 26B, 26C, 26D, 27B, 27C, 27D, 28B, 28C, 28D, 29B, 29C, 29D, 30B, 30C, 30D, 31B, 31C, 31D are cross-sectional views of an embodiment of a device 200 according to aspects of the method of FIG. 25.
Figure 26C:
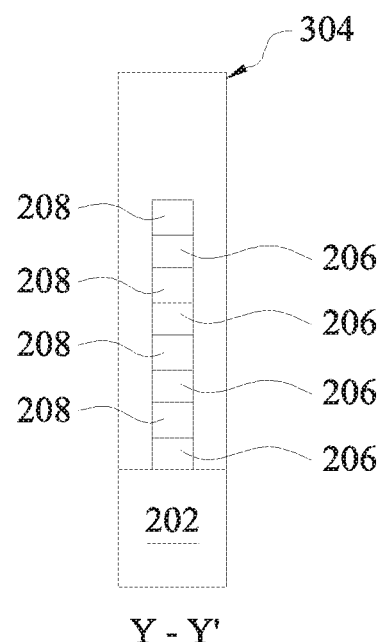
Figure 26D:
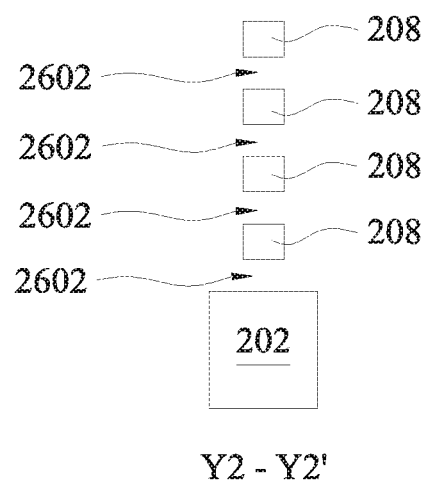
Figure 27A:
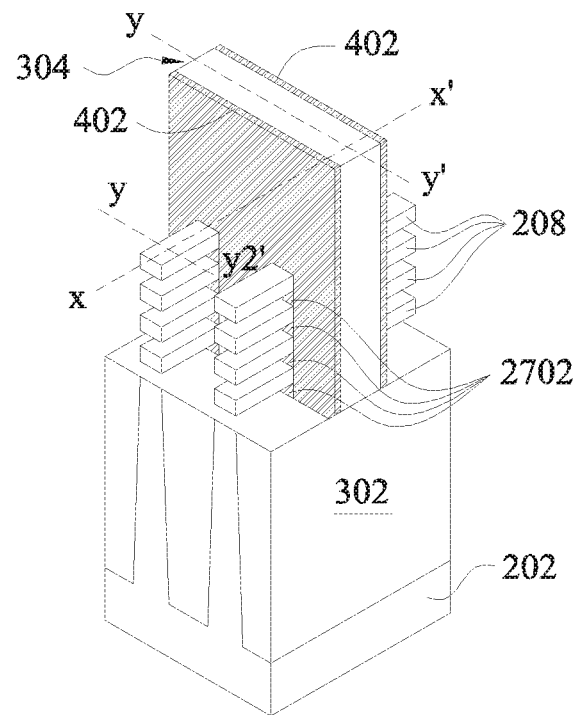
Figure 27B:
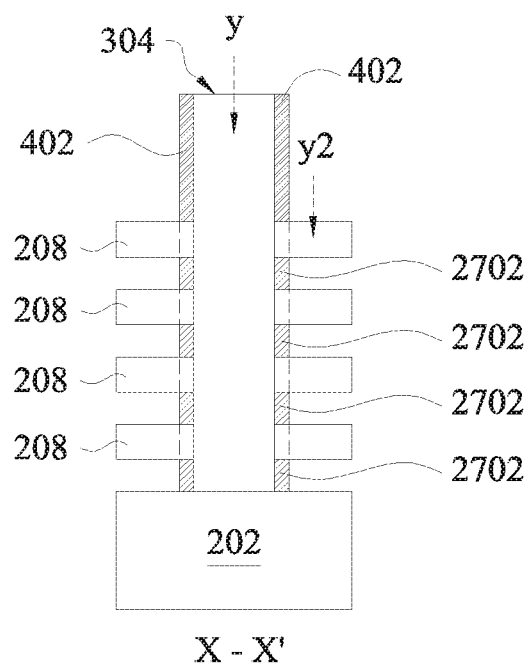
Figure 27C:
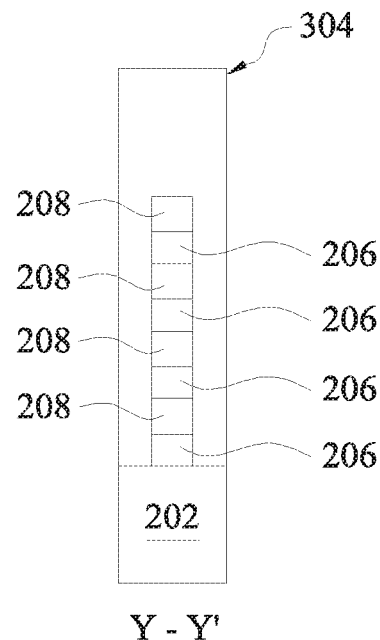
Figure 27D:
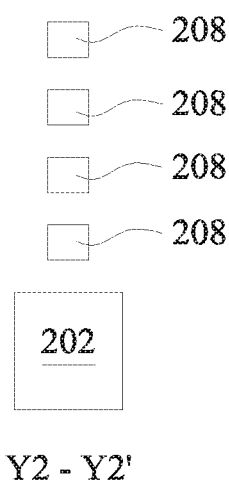

The method 2500 then proceeds to block 2512 where a select oxidation of the remaining epitaxial layers is performed. Again, it is noted during the selective etch removal of the epitaxial layers 206 in block 2511, that the spacer elements 402 protect the epitaxial layer portion 206A that is directly abutting the gate structure 304. In other words, FIGS. 26A and 26B illustrate that under the etched back spacer 402 there is an epitaxial layer 206A such that between the spacer elements 402 on the source/drain region of the fin 210, there is disposed epitaxial layer 206.

The oxidation process may be referred to as a selective oxidation as due to the varying oxidation rates of the layers of the epitaxial stack 204, certain layers are oxidized for example, portion 206A is oxidized to form oxidized portion 2702. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. Referring to the example of FIGS. 27A and 27B, an oxidized portion 2702 is formed from the portion 206A.

The method 2500 proceeds to block 2514 where a source/drain feature is formed. Block 2514 may include growing an epitaxial layer to form the source/drain feature. Block 2514 may be substantially similar to block 114, discussed above with reference to the method 100 of FIG. 1. Referring to the example of FIGS. 28A, 28B, 28C, 28D, and 28E an epitaxial material source/drain layer 702 is formed as discussed above. In contrast to the above embodiment of the method 100, embodiments of the method 2500 and embodiments of FIGS. 28A, 28B, 28C, and 28D illustrate that the epitaxial material of the source/drain layer 702 is grown on the epitaxial layers 208 that remain in the source/drain region and within the gaps and adjacent the oxidized portions 2702. The epitaxial material may also abut the spacer elements 402.

Figure 28A:
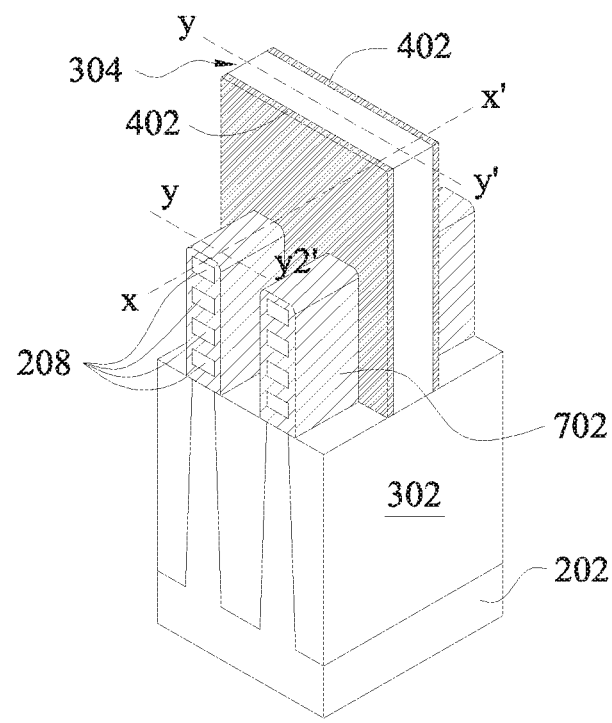
Figure 28B:
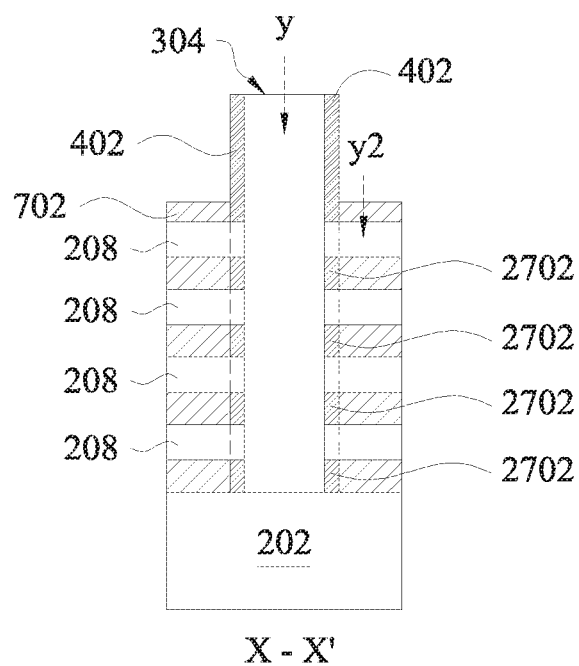
Figure 28C:
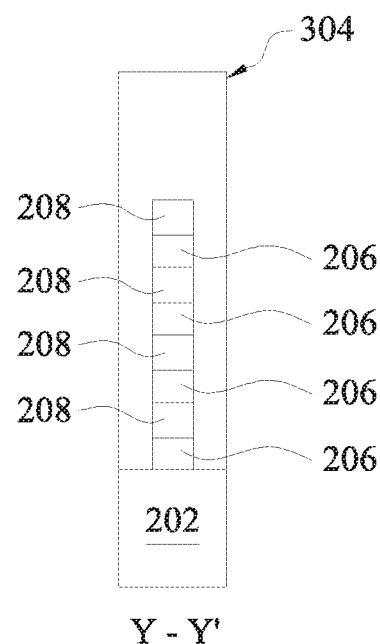
Figure 28D:
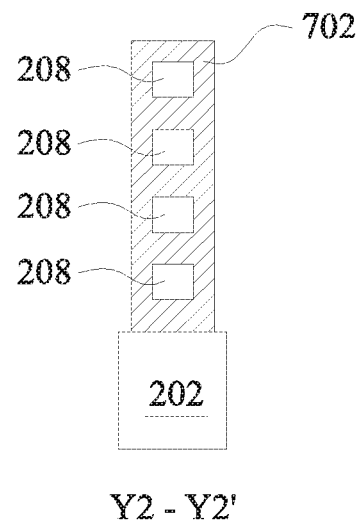
Figure 28E:
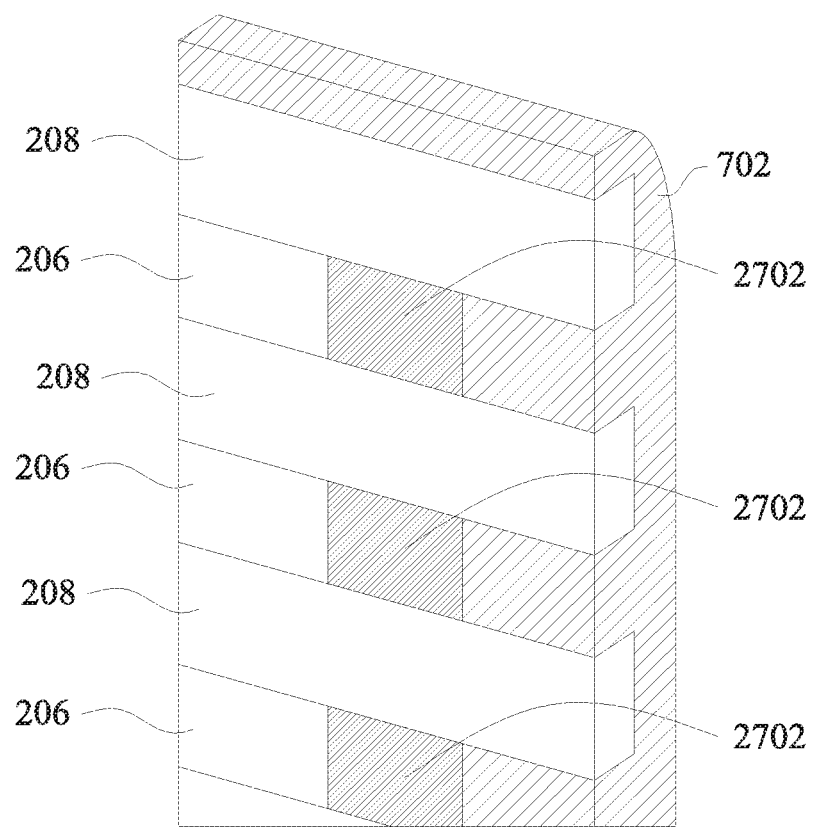
Figure 29A:
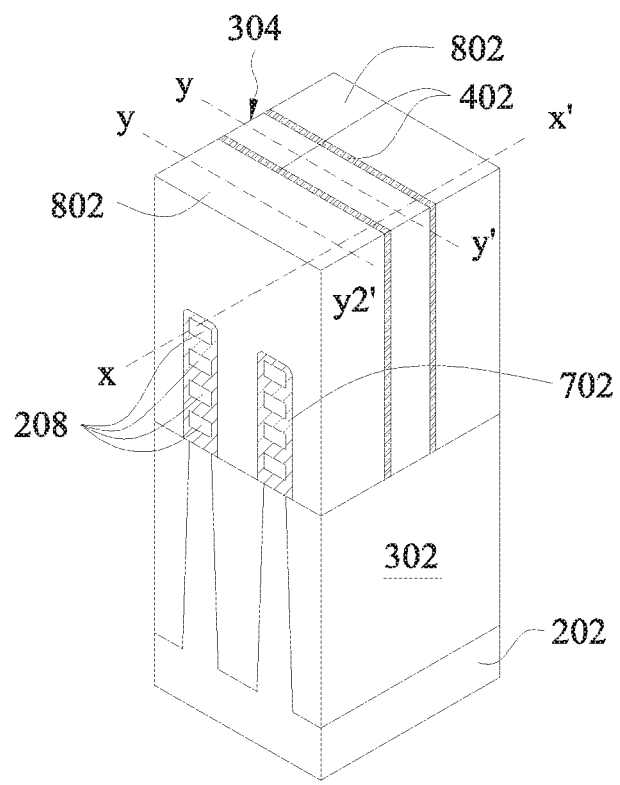
Figure 29B:
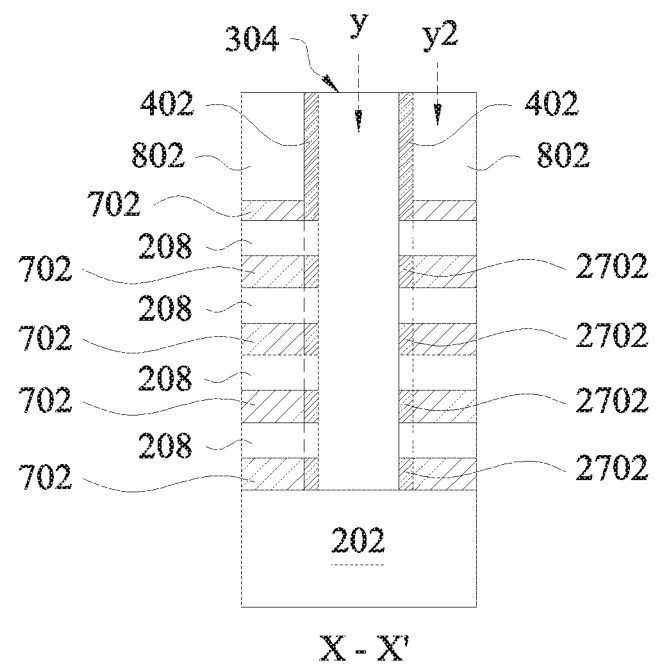
Figure 29C:
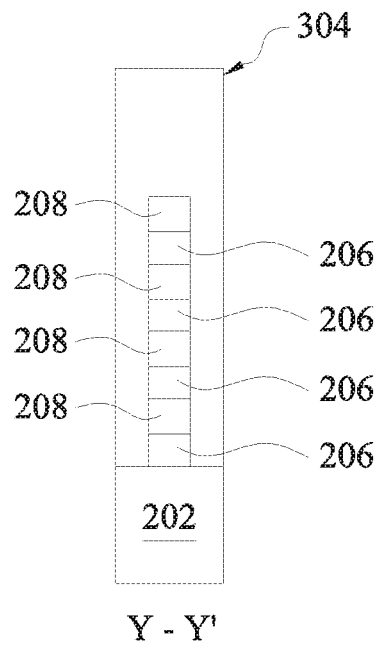
Figure 29D:
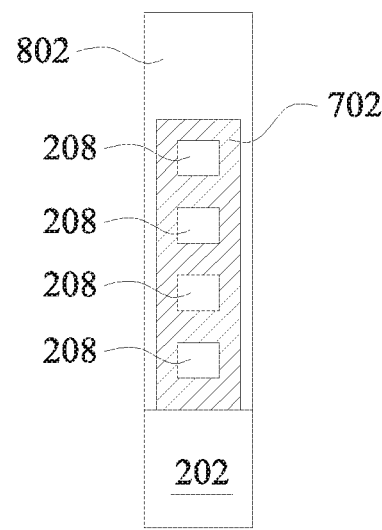
Figure 30A:
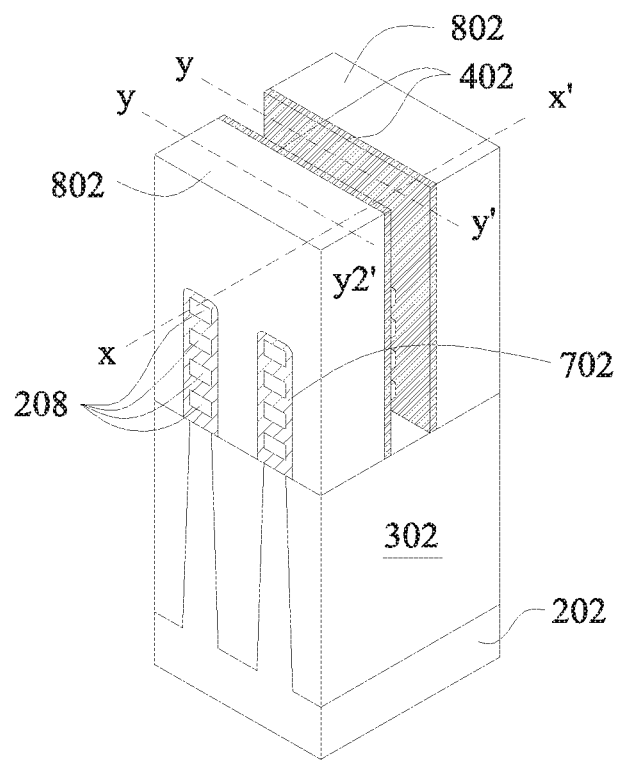
Figure 30B:
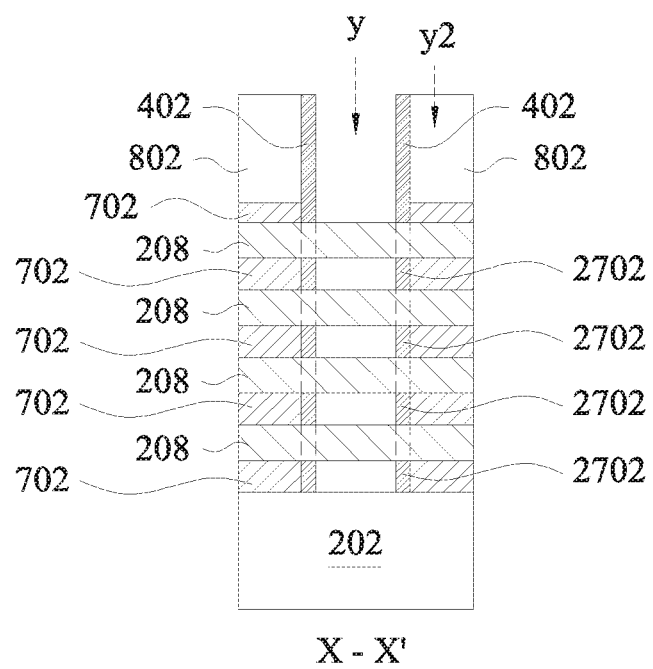
Figure 30C:
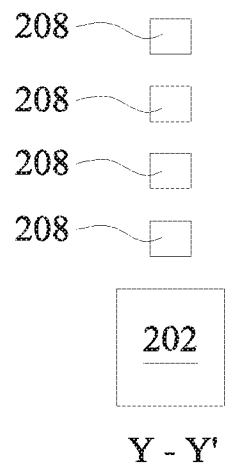
Figure 30D:
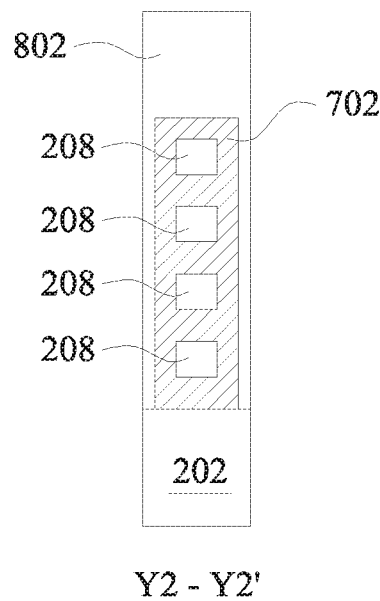
Figure 31A:
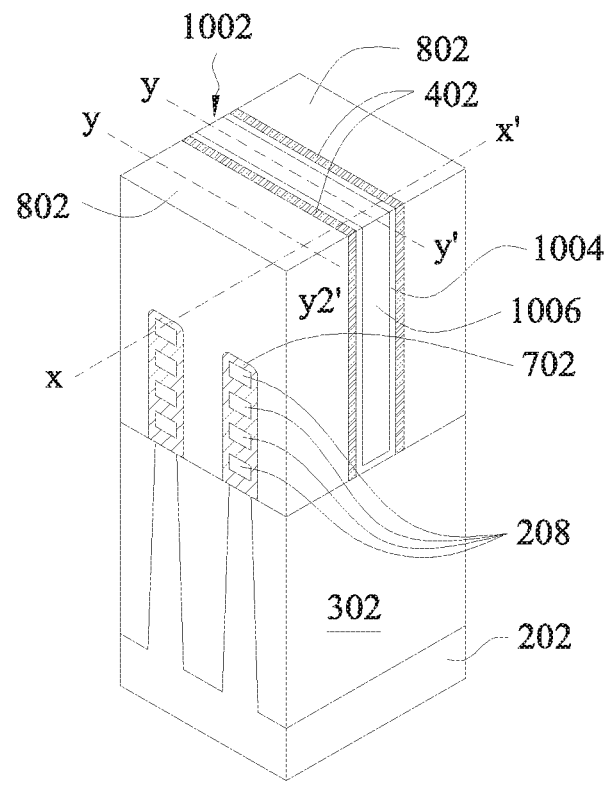
Figure 31B:
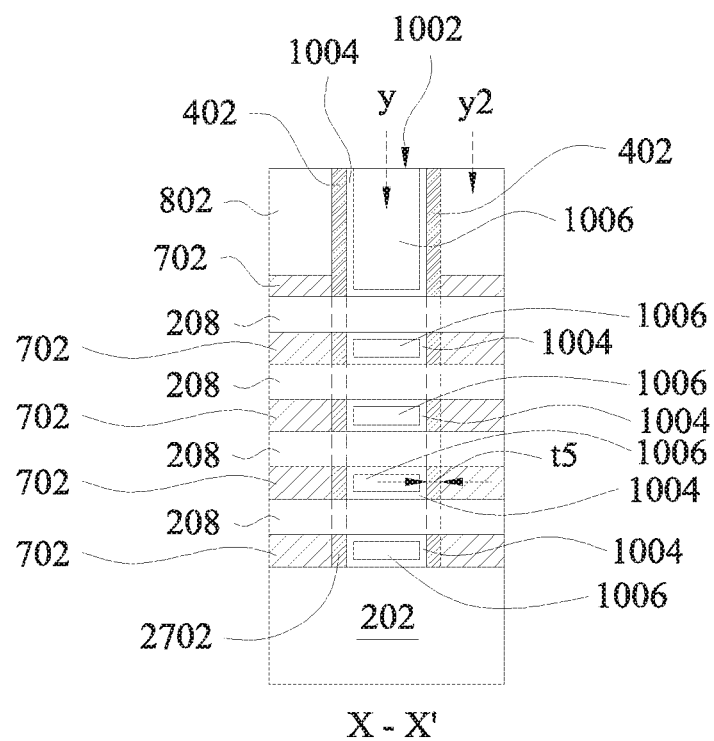
Figure 31C:
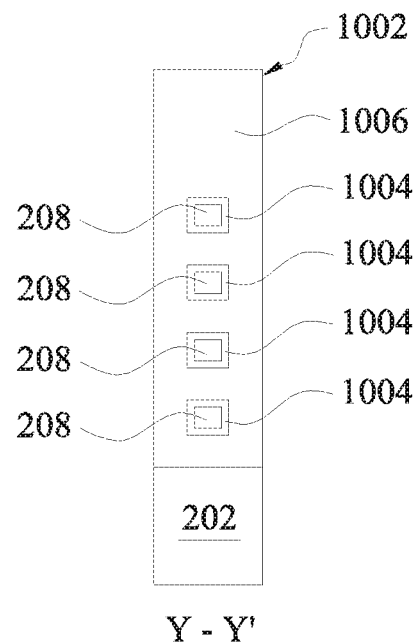
Figure 31D:
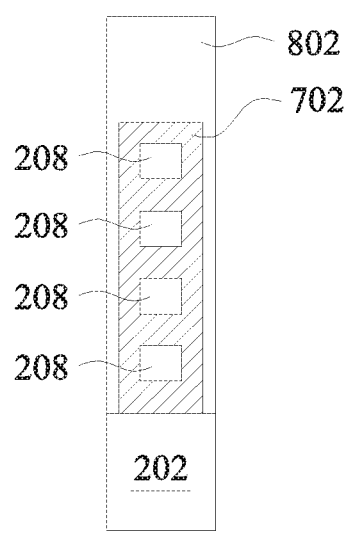

FIG. 28E illustrates a portion of the device 200 at block 2514, it is noted that the source/drain region of the device 200 includes the oxidized layer portion 2702 is disposed abutting the epitaxial layer 206 that underlies the gate structure 304. As discussed further below, the epitaxial layer 206 in the channel region (under the gate structure 304) will be removed and a portion of the final gate structure formed therein. Thus, the oxidized layer portion 2702 is coplanar with a portion of the gate structure in the source/drain region. The oxidized layer portion 2702 (e.g., SiGeO) is also coplanar with the source/drain feature 702.

The method 2500 proceeds to block 2516 where an inter-layer dielectric layer is formed. Block 1116 may be substantially similar to block 116, discussed above with reference to the method 100 of FIG. 1. Referring to the example of FIGS. 29A, 29B, 29C and 29D, an ILD layer 802 is formed as discussed above.

The method 2500 proceeds to block 2518 where a dummy gate removal is performed and/or a release of the nanowires of the epitaxial stack in the channel region are released. Block 2518 may be substantially similar to block 118, discussed above with reference to the method 100 of FIG. 1. Referring to the example of FIGS. 30A, 30B, 30C and 30D, the dummy gate structure 304 is removed to form a trench. Further, the epitaxial layers 208 in the channel region (e.g., under the trench) are also removed "releasing" the nanowires in the channel region (e.g., epitaxial layers 208).

The method 2500 proceeds to block 2520 where a gate structure (e.g., replacement gate structure, high-k metal gate structure) is formed. Block 2520 may be substantially similar to block 120, discussed above with reference to the method 100 of FIG. 1. Referring to the example of FIGS. 31A, 31B, 31C and 31D, a gate structure 1002 is formed including a gate dielectric 1004 and a gate electrode 1006.

In an embodiment, the oxidized portion 2702 provides an inner spacer having a length in the x-direction of t5. t5 may be between approximately 4 nanometers (nm) and approximately 6 nm. In an embodiment, the oxidized portion 2702 provides an inner spacer having a length in the y-direction of between approximately 5 nanometers (nm) and approximately 7 nm.

Figure 32:
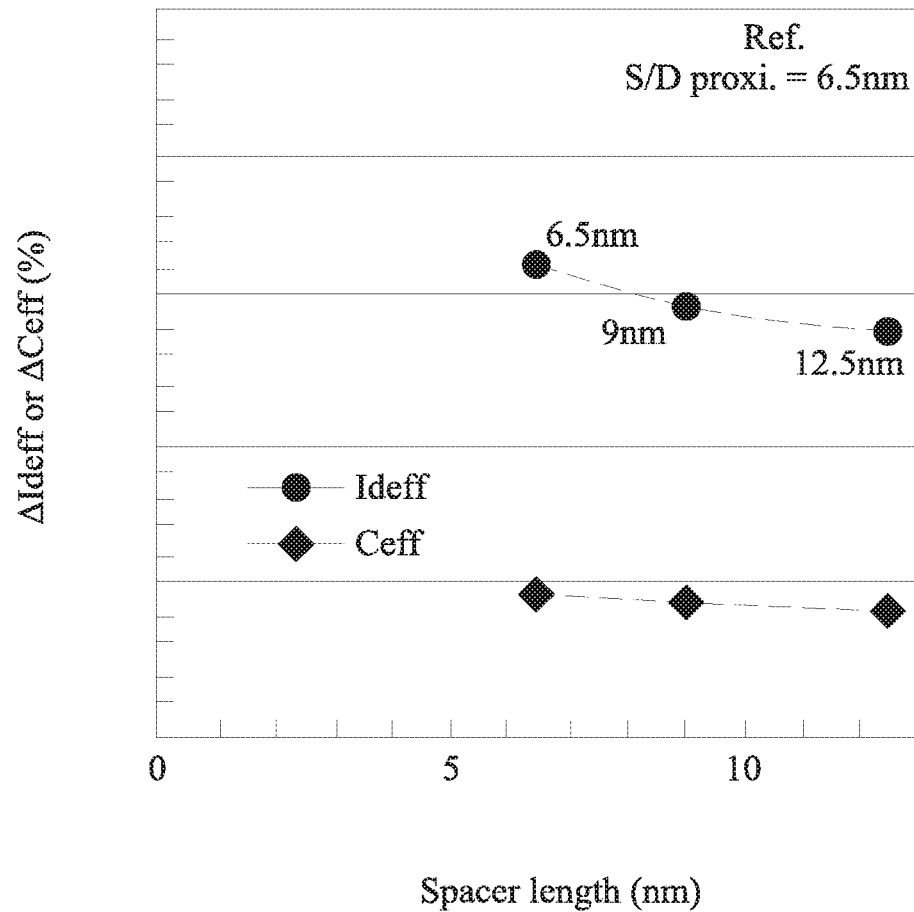
FIG. 32 illustrates an embodiment of a graphical representation of spacer length (nm) versus device performance (e.g., effective current or capacitance).

Thus, provided are methods and devices where a gate structure does not directly contact or abut a source/drain region. Configurations of dielectric materials (e.g., spacer elements (402) and/or oxidized epitaxial layers (e.g., 302)) interpose the source/drain features 702 and the gate structure 1002. In some embodiments, this provides a benefit of reducing the Cgd (gate-to-drain capacitance) of the device. In some embodiments, this provides Ceff (effective capacitance) of the device is reduced without obvious penalty to the Ieff. Therefore, in some embodiments, the speed of the circuit could be improved. FIG. 32 illustrates the relative performance for three exemplary experimental embodiments.

Thus, in an embodiment provided is a method of fabrication of a multi-gate semiconductor device that includes providing a fin having a plurality of a first type of epitaxial layers and a plurality of a second type of epitaxial layers. A first portion of a first layer of the second type of epitaxial layers is removed in a channel region of the fin to form an opening between a first layer of the first type of epitaxial layer and a second layer of the first type of epitaxial layer. A portion of a gate structure is then formed having a gate dielectric and a gate electrode in the opening. A dielectric material is formed abutting the portion of the gate structure.

In another of the broader embodiments, a method of fabricating a semiconductor device is provided that includes forming a first silicon layer and a second silicon layer. A silicon germanium (SiGe) layer is formed interposing the first and second silicon layers. A first portion of the SiGe layer is removed to provide an opening between the first and second silicon layers in a channel region. An oxidized second portion of the SiGe layer is provided adjacent the opening. The method provides for epitaxially growing a source/drain feature on the first and second silicon layers and abutting a sidewall of the oxidized second portion of the SiGe layer. A first region of a gate structure is formed in the opening, wherein each of the first and second silicon layers adjacent the gate structure provides a channel.

Also discussed is a multi-gate semiconductor device having a fin element, a gate structure over the fin element, an epitaxial source/drain feature adjacent the fin element; a dielectric spacer interposing the gate structure and the epitaxial source/drain feature.

What is claimed is:

1. A multi-gate semiconductor device, comprising:
   a first layer having a first composition, the first layer extending from a source/drain region of the first layer to a channel region of the first layer;
   a second layer having the first composition, the second layer extending from a source/drain region of the second layer to a channel region of the second layer and spaced above the first layer;
   a gate structure interposed between the channel region of the first layer and the channel region of the second layer;
   an epitaxial layer having a second composition interposing the source/drain region of the first layer and the source drain region of the second layer; and
   a dielectric material disposed between the first layer and the second layer, the dielectric material interposing the gate structure and the epitaxial layer.

2. The multi-gate semiconductor device of claim 1, wherein the dielectric material is silicon germanium oxide.

3. The multi-gate semiconductor device of claim 1, wherein the dielectric material is at least one of silicon oxide, silicon nitride, silicon carbide, silicon oxynitride, SiCN, silicon oxycarbide, or SiOCN.

4. The multi-gate semiconductor device of claim 1, wherein a second dielectric material different than the dielectric material is disposed on sidewalls of the gate structure.

5. The multi-gate semiconductor device of claim 1, wherein a thickness of the dielectric material is between approximately 4 nanometers (nm) and approximately 6 nm.

6. The multi-gate semiconductor device of claim 1, wherein epitaxial layer directly interfaces a first sidewall of the dielectric material and a gate dielectric material of the gate structure directly interfaces a second sidewall of the dielectric material, the second sidewall opposing the first sidewall.

7. The multi-gate semiconductor device of claim 6, wherein a distance between the first sidewall and the second sidewall is between approximately 4 nanometers (nm) and approximately 6 nm.

8. The multi-gate semiconductor device of claim 1, wherein the first composition is silicon.

9. A multi-gate semiconductor device, comprising:
   a first silicon layer extending from a source/drain region of the first silicon layer to a channel region of the first silicon layer;
   a second silicon layer extending from a source/drain region of the second silicon layer to a channel region of the second silicon layer and spaced above the first silicon layer;
   a gate structure interposed between the channel region of the first silicon layer and the channel region of the second silicon layer;
   an epitaxial layer having a second composition interposing the source/drain region of the first silicon layer and the source/drain region of the second silicon layer; and
   a dielectric material disposed between the first silicon layer and the second silicon layer, the dielectric material interposing the gate structure and the epitaxial layer.

10. The multi-gate semiconductor device of claim 9, wherein the dielectric material includes silicon germanium oxide.

11. The multi-gate semiconductor device of claim 9, further comprising:
    spacer elements abutting a portion of the gate structure overlying the first silicon layer.

12. The multi-gate semiconductor device of claim 11, wherein the spacer elements have a different composition than the dielectric material.

13. The multi-gate semiconductor device of claim 11, wherein the spacer elements comprise at least one of silicon oxide, silicon nitride, silicon carbide, silicon oxynitride, SiCN, silicon oxycarbide, or SiOCN.

14. The multi-gate semiconductor device of claim 9, wherein the epitaxial layer extends from a top surface of the second silicon layer to a bottom surface of the first silicon layer.

15. A multi-gate semiconductor device, comprising:
    a first layer having a first composition, the first layer extending from a source/drain region of the first layer to a channel region of the first layer;
    a second layer having the first composition, the second layer extending from a source/drain region of the second layer to a channel region of the second layer and spaced above the first layer;
    a gate structure interposed between the channel region of the first layer and the channel region of the second layer;
    an epitaxial layer having a second composition extending from a bottom surface of the first layer in the source/drain region of the first layer to a top surface of the second layer in the source/drain region of the second layer; and
    a dielectric material extending between the first layer and the second layer, the dielectric material interposing the gate structure and the epitaxial layer.

16. The multi-gate semiconductor device of claim 15, wherein the dielectric material extends between the bottom surface of the first layer and the top surface of the second layer.

17. The multi-gate semiconductor device of claim 15, wherein the epitaxial layer extends to a side surface of the first layer and a side surface of the second layer.

18. The multi-gate semiconductor device of claim 15, wherein the first layer and the second layer include silicon.

19. The multi-gate semiconductor device of claim 15, wherein the dielectric material interfaces a gate dielectric layer of the gate structure.

20. The multi-gate semiconductor device of claim 15, wherein the dielectric material extends from an interface with the gate structure to an interface with the epitaxial layer.

* * * * *